US012740434B2

(12) United States Patent
Takahata et al.

(10) Patent No.: US 12,740,434 B2
(45) Date of Patent: Sep. 15, 2026

(54) ALIGNMENT MARK AND IMPRINTING METHOD

(71) Applicant: Kioxia Corporation, Tokyo (JP)

(72) Inventors: Kazuhiro Takahata, Yokohama Kanagawa (JP); Takashi Sato, Fujisawa Kanagawa (JP)

(73) Assignee: Kioxia Corporation, Tokyo (JP)

(*) Notice: Subject to any disclaimer, the term of this patent is extended or adjusted under 35 U.S.C. 154(b) by 431 days.

(21) Appl. No.: 18/460,820

(22) Filed: Sep. 5, 2023

(65) Prior Publication Data

US 2024/0203894 A1 Jun. 20, 2024

(30) Foreign Application Priority Data

Dec. 19, 2022 (JP) ................................ 2022-201840

(51) Int. Cl.

| | |
|---|---|
| ***H10W 46/00*** | (2026.01) |
| ***G03F 7/00*** | (2006.01) |
| ***G03F 9/00*** | (2006.01) |
| ***H10P 74/20*** | (2026.01) |

(52) U.S. Cl.

CPC .......... *H10W 46/00* (2026.01); *G03F 7/0002* (2013.01); *G03F 9/7076* (2013.01); *H10P 74/203* (2026.01); *H10W 46/301* (2026.01)

(58) Field of Classification Search

CPC .................. H01L 23/544; H01L 22/12; H01L 2223/54426; G03F 7/0002; G03F 9/7076

See application file for complete search history.

(56) References Cited

U.S. PATENT DOCUMENTS

| | | | | |
|---|---|---|---|---|
| 6,486,954 | B1 | 11/2002 | Mieher et al. | |
| 6,628,392 | B2 | 9/2003 | Kuroda et al. | |
| 9,335,627 | B2 | 5/2016 | Kikuchi et al. | |
| 2012/0244319 | A1 | 9/2012 | Wuister et al. | |
| 2015/0332452 | A1* | 11/2015 | Tsuchiya | G01N 21/956 382/147 |
| 2019/0080899 | A1* | 3/2019 | Mitsugi | H10P 76/00 |
| 2021/0072638 | A1* | 3/2021 | Mitsuyasu | G03F 7/0002 |

FOREIGN PATENT DOCUMENTS

| | | | | |
|---|---|---|---|---|
| JP | 2002-062489 A | | 2/2002 | |
| JP | 2002169266 A | * | 6/2002 | G03F 7/70483 |
| JP | 2004507901 A | | 3/2004 | |
| JP | 4228058 B | | 2/2009 | |
| JP | 4731759 B | | 7/2011 | |
| JP | 5284423 B2 | | 9/2013 | |
| JP | 5658271 B2 | | 12/2014 | |
| KR | 20160124029 A | * | 10/2016 | G01N 21/9501 |

* cited by examiner

*Primary Examiner* — Eliseo Ramos Feliciano
*Assistant Examiner* — Timothy Edward Duren
(74) *Attorney, Agent, or Firm* — Maier & Maier, PLLC

(57) ABSTRACT

According to one embodiment, an alignment mark includes a first mark arranged in a first film having optical transparency of a first substrate on which a device is manufactured; a second mark that is arranged in a second substrate having a first pattern to be transferred to the first substrate side, and is used for alignment with the first mark; and a second pattern that is arranged in at least any of the first and second substrates at a position overlapping a peripheral region of the first mark when viewed from the second substrate side, the first substrate and the second substrate being arranged at positions where the first and second marks vertically overlap each other, in which the second pattern has a random dimensional distribution.

20 Claims, 17 Drawing Sheets

ALIGNMENT MARK AND IMPRINTING METHOD

CROSS-REFERENCE TO RELATED APPLICATIONS

This application is based upon and claims the benefit of priority from Japanese Patent Application No. 2022-201840, filed on Dec. 19, 2022; the entire contents of which are incorporated herein by reference.

FIELD

Embodiments of the present invention relate to an alignment mark and an imprinting method.

BACKGROUND

A manufacturing process of a semiconductor device may include imprinting processing. In the imprinting processing, a pattern of a template is transferred to a shot region of a substrate. In this case, alignment between the template and the substrate is performed using alignment marks respectively provided on the template and the substrate.

The alignment mark includes a rough alignment mark used for rough alignment and a fine alignment mark used for precise alignment. In addition, in order to further improve the alignment accuracy by the fine alignment mark, polarized illumination may be used as a light source for alignment. However, by using polarized illumination, interference due to multiple reflection occurs in the detection light of the mark, and positional deviation may occur in the rough alignment mark.

BRIEF DESCRIPTION OF THE DRAWINGS

FIGS. 9A to 9C are cross-sectional views sequentially illustrating a part of the procedure of the method for manufacturing the semiconductor device according to the embodiment;

DETAILED DESCRIPTION

According to one embodiment, an alignment mark includes a first mark arranged in a first film having optical transparency of a first substrate on which a device is manufactured; a second mark that is arranged in a second substrate having a first pattern to be transferred to the first substrate side, and is used for alignment with the first mark; and a second pattern that is arranged in at least any of the first and second substrates at a position overlapping a peripheral region of the first mark when viewed from the second substrate side, the first substrate and the second substrate being arranged at positions where the first and second marks vertically overlap each other, in which the second pattern has a random dimensional distribution.

Hereinafter, embodiments of the present invention will be described in detail with reference to the drawings. The present invention is not limited to the following embodiments. In addition, constituent elements in the following embodiments include those that can be easily assumed by those skilled in the art or those that are substantially the same.

(Configuration Example of Imprinting Device)

Figure 1A:
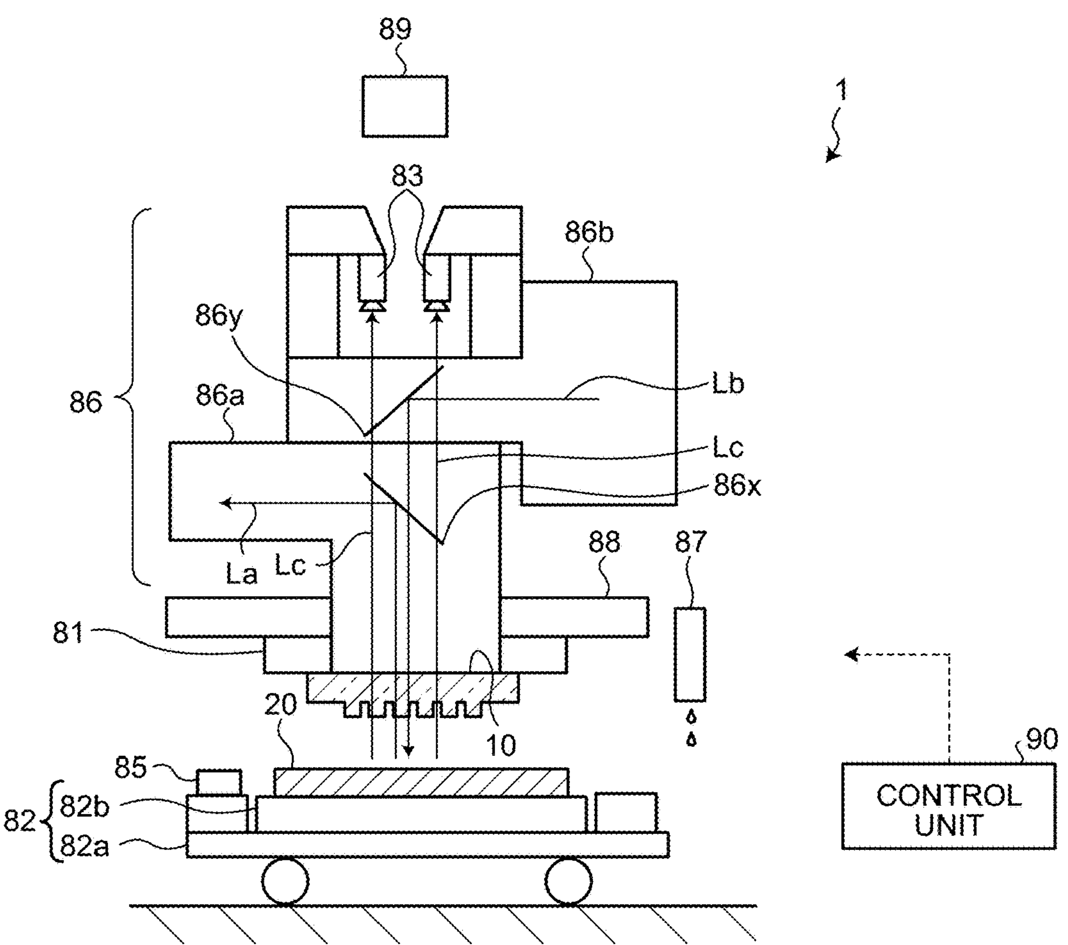
FIGS. 1A and 1B are schematic views illustrating an example of a configuration of an imprinting device according to an embodiment.
Figure 1B:
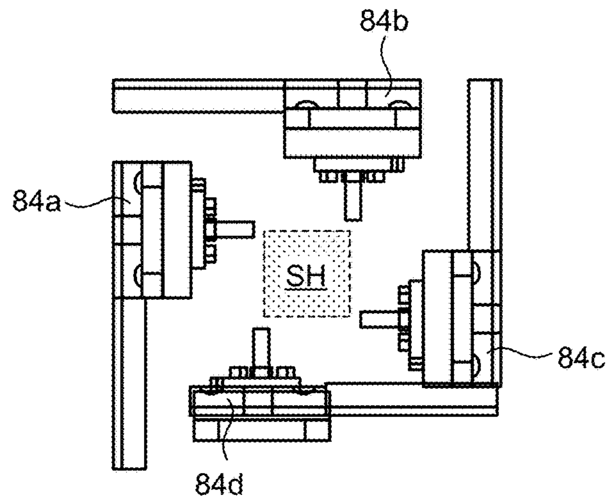

FIGS. 1A and 1B are schematic views illustrating an example of a configuration of an imprinting device 1 according to an embodiment. FIG. 1A is an overall view of the imprinting device 1, and FIG. 1B is an enlarged view of a detection system **86*a* illustrating a detailed configuration of an imaging element 84 (84*a* to 84*d*) included in the imprinting device 1**.

As illustrated in FIGS. 1A and 1B, the imprinting device 1 includes a template stage 81, a wafer stage 82, imaging elements 83 and **84*a* to 84*d*, a reference mark 85, an alignment unit 86, a liquid dropping device 87, a stage base 88, a light source 89, and a control unit 90. In the imprinting device 1, a template 10 for transferring a pattern to a resist on a wafer 20 can be mounted. The wafer 20 is subjected to various kinds of processing including processing in the imprinting device 1 to manufacture a semiconductor device. Such a wafer 20** may be a semiconductor substrate, an insulating substrate, a conductive substrate, or the like.

The wafer stage 82 includes a wafer chuck **82*b* and a main body 82*a*. The wafer chuck 82*b* is configured as a suction chuck that sucks the wafer 20 to a predetermined position on the main body 82***a*. The reference mark 85 is provided on the wafer stage 82. The reference mark 85 is used for alignment in a case where the wafer 20 is loaded on the wafer stage 82.

The wafer 20 is placed on the wafer stage 82, and the wafer stage 82 is moved in a plane (horizontal plane) parallel to the placed wafer 20. The wafer stage 82 moves the wafer 20 to the lower side of the liquid dropping device 87 in a case of dropping the resist on the wafer 20, and moves the wafer 20 to the lower side of the template 10 in a case of performing the transfer processing to the wafer 20.

The stage base 88 supports the template 10 by the template stage 81, and presses the pattern of the template 10 against the resist on the wafer 20 by being moved in an up and down direction (vertical direction).

The alignment unit 86 including a plurality of imaging elements 83 is provided on the stage base 88. The alignment unit 86 detects the position of the wafer 20 and the position of the template 10 on the basis of the alignment marks respectively provided on the wafer 20 and the template 10.

The alignment unit 86 includes the detection system 86*a* and an illumination system 86*b*. The illumination system 86*b* applies light to the wafer 20 and the template 10 to make alignment marks formed on the wafer 20 and the template 10 visible. The detection system 86*a* detects images of the alignment marks, and aligns the positions of the alignment marks to align the wafer 20 and the template 10.

The detection system 86*a* and the illumination system 86*b* include mirrors 86*x* and 86*y* such as dichroic mirrors as image forming units, respectively. The mirrors 86*x* and 86*y* form images from the wafer 20 and the template 10 such as alignment marks by light from the illumination system 86*b*.

Specifically, light Lb from the illumination system 86*b* is reflected downward where the wafer 20 or the like is arranged, by the mirror 86*y*. In addition, light La from the wafer 20 or the like is reflected toward the detection system 86*a* by the mirror 86*x*. A part of light Lc from the wafer 20 or the like passes through the mirrors 86*x* and 86*y*, and travels toward the imaging elements 83 on the upper side.

The imaging elements 83 capture the part of light Lc as an image including the alignment mark or the like. The image captured by the imaging elements 83 is used by the control unit 90 to observe the state of the alignment mark.

On the other hand, the light La reflected toward the detection system 86*a* by the mirror 86*x* travels toward the plurality of imaging elements 84*a* to 84*d* included in the detection system 86*a*.

As illustrated in FIG. 1B, the plurality of imaging elements 84*a* to 84*d* is arranged to be able to image different points of one shot region SH on the wafer 20, which is an imprinting region of the template 10, for example.

The imaging elements 84*a* to 84*d* capture the light La reflected by the mirror 86*x* as images including the alignment mark or the like. The images captured by the imaging elements 84*a* to 84*d* are used by the control unit 90 to align the wafer 20 and the template 10.

The liquid dropping device 87 is a device that drops the resist on the wafer 20 by an inkjet method. An inkjet head included in the liquid dropping device 87 has a plurality of fine holes for ejecting droplets of the resist, and drops the droplets of the resist to one shot region SH on the wafer 20.

The imprinting device 1 according to the embodiment is configured to drop the resist on the wafer 20, but the resist may be applied to the entire surface of the wafer 20 by a spin coating method.

The light source 89 is, for example, a device that emits light such as ultraviolet light for curing the resist, and is provided above the stage base 88. The light source 89 emits light from above the template 10 while the template 10 is pressed against the resist.

The control unit 90 is configured as a computer including, for example, a hardware processor such as a central processing unit (CPU), a memory, a hard disk drive (HDD), and the like. The control unit 90 controls the template stage 81, the wafer stage 82, the reference mark 85, the alignment unit 86 including the imaging elements 83 and 84*a* to 84*d*, the liquid dropping device 87, the stage base 88, and the light source 89.

Next, a detailed configuration of the illumination system 86*b* of the alignment unit 86 included in the imprinting device 1 will be described with reference to FIGS. 2A and 2B.

Figure 2A:
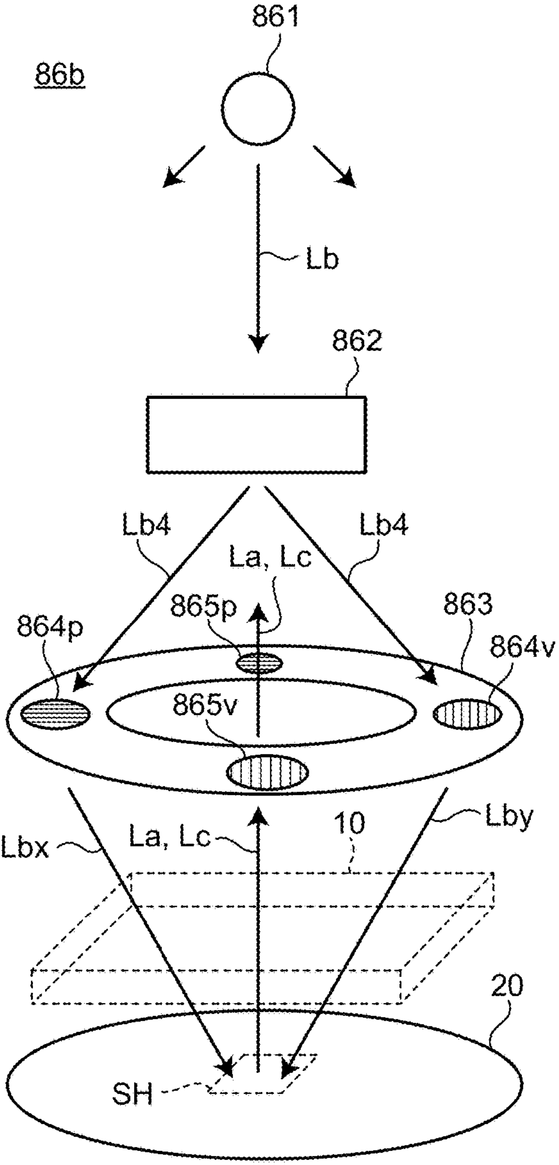
FIGS. 2A and 2B are schematic views illustrating an example of a configuration of an illumination system of an alignment unit included in the imprinting device according to the embodiment.
Figure 2B:
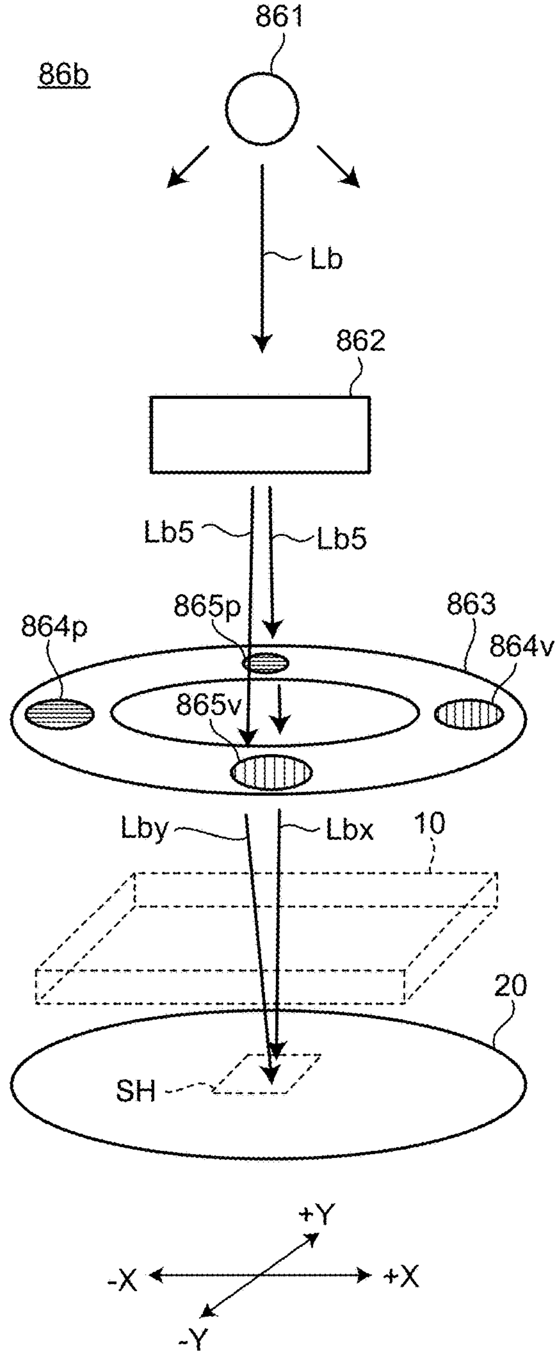

FIGS. 2A and 2B are schematic views illustrating an example of a configuration of the illumination system 86*b* of the alignment unit 86 included in the imprinting device 1 according to the embodiment. FIG. 2A is a view illustrating a state of aligning the template 10 and the wafer 20 in a Y direction. FIG. 2B is a view illustrating a state of aligning the template 10 and the wafer 20 in an X direction.

In the present specification, both the X direction and the Y direction are directions along the surface of the wafer 20, and are orthogonal to each other. In a case where various configurations of the template 10 and the wafer 20 are illustrated, a direction along the X direction may be referred to as a first direction, and a direction along the Y direction may be referred to as a second direction. However, since various configurations of the template 10 and the wafer 20 may include a manufacturing error, the first direction and the second direction are not necessarily orthogonal to each other.

In FIGS. 2A and 2B, the left and right directions on the paper are defined as the −X direction and the +X direction, respectively, the depth direction on the paper is defined as the +Y direction, and the front direction on the paper is defined as the −Y direction.

As illustrated in FIGS. 2A and 2B, the illumination system 86*b* of the alignment unit 86 includes a light source 861, a splitter 862, and a polarizing plate 863. The light source 861, the splitter 862, and the polarizing plate 863 are arranged in this order so as to approach the template 10 and the wafer 20 that are illumination targets.

The light source 861 emits coherent monochromatic light in which a wavelength and a phase are aligned. The splitter 862 splits the traveling direction of the light Lb emitted from the light source 861 into a plurality of directions. In this case, the splitter 862 can split the light Lb toward the +X direction and the −X direction, or toward the +Y direction and the −Y direction.

The polarizing plate 863 has an annular shape, and includes a plurality of polarizing filters 864*p*, 864*v*, 865*p*, and 865*v* in an annular portion. With the central portion of the annular polarizing plate 863 as the origin, one of the polarizing filters 864*p* and 864*v* is arranged on a side of the annular portion in the +X direction, and the other thereof is arranged on a side in the −X direction. In addition, one of the polarizing filters 865*p* and 865*v* is arranged on a side of the annular portion in the +Y direction, and the other thereof is arranged on a side in the −Y direction.

The polarizing filters 864*p* and 865*p* transmit the light Lbx of which the vibration direction is the X direction, and the polarizing filters 864*v* and 865*v* transmit the light Lby of which the vibration direction is the Y direction. Among these polarizing filters 864*p*, 864*v*, 865*p*, and 865*v*, the polarizing filters 864*p* and 864*v* are used as a pair, and the polarizing filters 865*p* and 865*v* are used as a pair.

In a case where the splitter 862 splits the light Lb4 toward the +X direction and toward the −X direction, the light Lb4 reaches the polarizing filters 864*p* and 864*v*, and a part of the light Lb4 is transmitted through the polarizing filters 864*p* and 864*v*. In addition, in a case where the splitter 862 splits the light Lb5 toward the +Y direction and toward the −Y direction, the light Lb5 reaches the polarizing filters 865*p* and 865*v*, and a part of the light Lb5 is transmitted through the polarizing filters 865*p* and 865*v*.

Here, in a case where the alignment between the template 10 and the wafer 20 is performed, the alignment marks respectively provided on the template 10 and the wafer 20 are sequentially aligned in two directions orthogonal to each other such as the X direction and the Y direction while being observed by the detection system 86*a* of the alignment unit 86.

As illustrated in FIG. 2A, in the alignment of the template 10 and the wafer 20 in the Y direction, the light Lb4 branched in the +X directions by the splitter 862 is polarized into the light Lbx having the vibration in the X direction and the light Lby having the vibration in the Y direction, by the polarizing filters 864*p* and 864*v* of the polarizing plate 863. Under the illumination using the light Lbx and Lby, alignment marks are observed to perform alignment in the Y direction. The light La and Lc from the alignment marks is detected through an opening portion at the center of the annular polarizing plate 863.

The template 10 is made of a transparent member such as quartz as described later. Therefore, a part of the light Lbx and Lby reaching the template 10 passes through the template 10, and reaches the wafer 20. The light La and Lc reflected by the wafer 20 passes through the template 10, and reaches the detection system 86*a*. As a result, both the alignment marks respectively provided on the template 10 and the wafer 20 can be observed by the detection system 86*a*.

As illustrated in FIG. 2B, in the alignment of the template 10 and the wafer 20 in the X direction, the light Lb5 branched in the +Y directions by the splitter 862 is polarized into the light Lbx having the vibration in the X direction and the light Lby having the vibration in the Y direction, by the polarizing filters 865*p* and 865*v* of the polarizing plate 863. Under the illumination using the light Lbx and Lby, alignment marks are observed to perform alignment in the X direction. The light La and Lc from the template 10 and the wafer 20 is detected through the opening portion at the center of the annular polarizing plate 863 in the same manner as described above.

As described above, by using polarized illumination in which the vibration directions are aligned, irregular reflection of light and the like can be suppressed to improve the accuracy of position detection of the alignment marks, and the accuracy of alignment can also be improved. In addition, by using asymmetric polarized light orthogonal to the X direction and the Y direction, interference between polarized light can be suppressed, and occurrence of interference fringes on the surface of the wafer 20 or the like as the observation target can be suppressed. Note that the illumination method using the polarizing plate 863 as described above is also referred to as dipole illumination or the like.

Next, a detailed configuration example of the template stage 81 included in the imprinting device 1 and the template 10 mounted on the template stage 81 will be described with reference to FIGS. 3A to 4B.

Figures 3A, 3B:
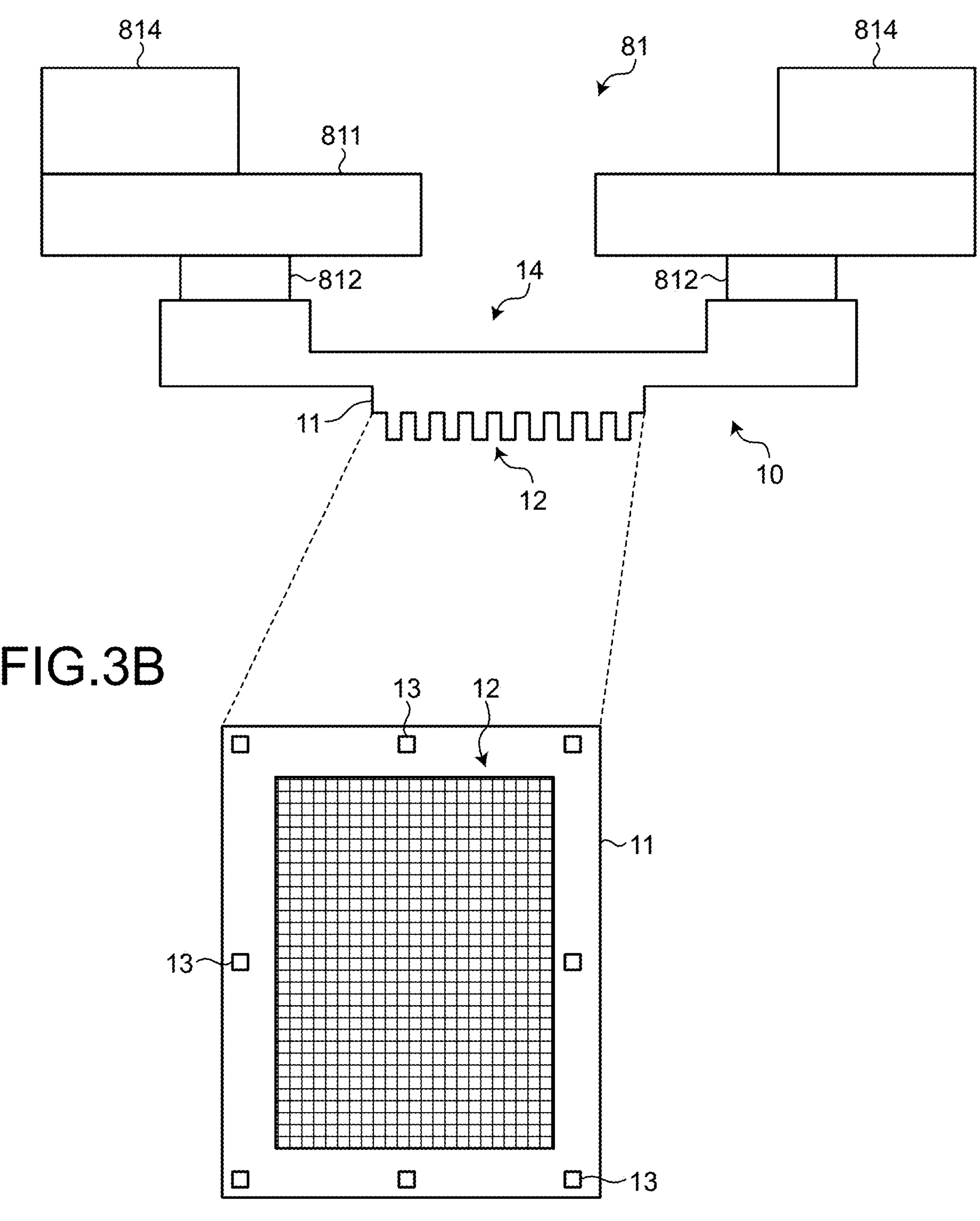
FIGS. 3A and 3B are schematic views illustrating an example of a configuration of a template stage included in the imprinting device according to the embodiment.

FIGS. 3A and 3B are schematic views illustrating an example of a configuration of the template stage 81 included in the imprinting device 1 according to the embodiment. FIG. 3A is a cross-sectional view of the template stage 81 and the template 10. FIG. 3B is a top view of the pattern 12 included in the template 10 held on the template stage 81.

As illustrated in FIG. 3A, the template stage 81 includes a main body 811, a template chuck 812, and a drive unit 814.

The main body 811 of the template stage 81 is a flat plate-like member, and holds the template 10 on the lower surface by the template chuck 812. The template chuck 812 is provided on the lower surface of the main body 811, and holds the template 10 above the wafer 20 with the pattern 12 facing downward, by vacuum suction by a suction mechanism (not illustrated).

The drive unit 814 raises and lowers the template stage 81 by a motor or the like (not illustrated) while the template 10 is held. In this case, by adjusting the driving force of the motor or the like of the drive unit 814, the lifting speed of the template stage 81, the inclination of the template 10 with respect to the wafer 20, the force of pressing the pattern 12 of the template 10 against the resist on the wafer 20, and the like can be controlled.

In addition, the drive unit 814 moves the template stage 81 in a direction along the surfaces of the template 10 and the wafer 20, that is, in a horizontal direction by a motor or the like (not illustrated) in a state where the template 10 is held. As a result, the relative positions of the template 10 and the wafer 20 in the horizontal direction are adjusted.

The template 10 is a substrate such as a substantially flat plate-like quartz member, and includes a mesa portion 11 protruding from a lower surface in a state of being held by the template stage 81, and a pattern 12 formed on a surface of the mesa portion 11. A recess portion called a core-out portion 14 is provided on a rear surface of the template 10, that is, on a surface opposite to the pattern 12.

As illustrated in FIG. 3B, a plurality of alignment marks 13 is provided on the surface of the mesa portion 11 of the template 10, that is, on the contact surface with the resist on the wafer 20, together with the pattern 12.

The pattern 12 as a first pattern has an arbitrary shape, and is transferred to the resist on the wafer 20. A region on the wafer 20 to which the pattern 12 has been transferred corresponds to, for example, an element region of the semiconductor device, and the pattern 12 is transferred to this element region to form a partial configuration of the semiconductor device. The pattern 12 of the template 10 which becomes a partial configuration of the semiconductor device is an example of an actual pattern.

The plurality of alignment marks 13 is provided around the pattern 12 of the template 10.

The pattern 12 and the alignment mark 13 have, for example, a convex shape protruding from the contact surface with the resist in a case where the template 10 is pressed against the resist on the wafer 20.

Figure 4A:
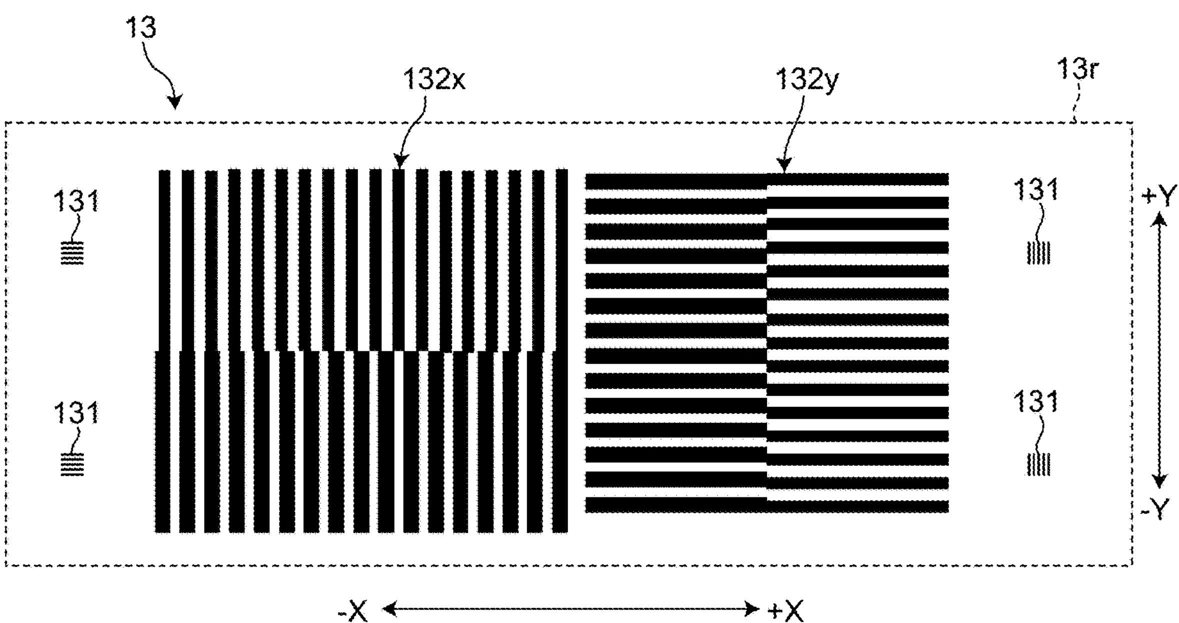
FIGS. 4A and 4B are schematic views illustrating an example of a configuration of an alignment mark included in a template according to the embodiment.
Figure 4B:
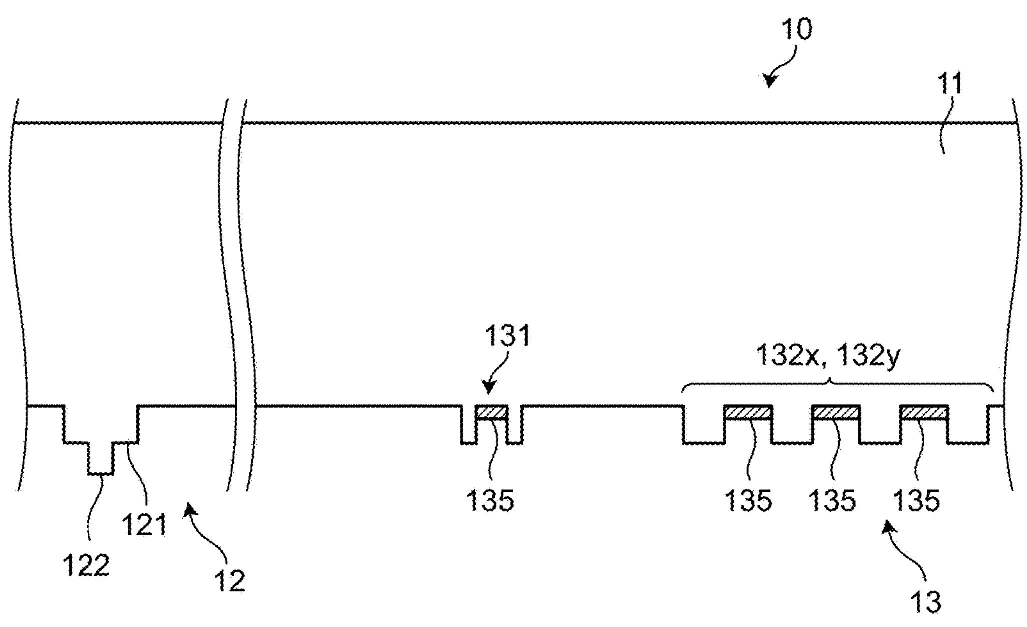

FIGS. 4A and 4B are schematic views illustrating an example of a configuration of the alignment mark 13 included in the template 10 according to the embodiment. FIG. 4A is a plan view illustrating an overall configuration of the alignment mark 13, and FIG. 4B is a cross-sectional view of the alignment mark 13 and the pattern 12.

However, FIG. 4A illustrates the alignment mark 13 when the template 10 is viewed through the surface opposite to the surface on which the pattern 12 is formed. In FIG. 4A, the left and right directions on the paper are defined as the −X direction and the +X direction, respectively, and the up and down directions on the paper are defined as the +Y direction and the −Y direction.

As illustrated in FIG. 4A, each alignment mark 13 of the template 10 includes rough alignment marks 131 as a second mark, a fine alignment mark 132*x* as a fourth mark, and a fine alignment mark 132*y*.

A pair of rough alignment marks 131 included in the alignment mark 13 of the template 10 is provided side by side in the Y direction at both end portions of a mark region 13*r*, where the alignment mark 13 is provided, in the X direction, for example.

The fine alignment marks 132*x* and 132*y* included in the alignment mark 13 of the template 10 are provided, for example, between the rough alignment marks 131 at both end portions in the X direction. In the example of FIG. 4A, the fine alignment marks 132*x* and 132*y* are arranged side by side in the X direction, the fine alignment mark 132*x* is arranged closer to the −X direction, and the fine alignment mark 132*y* is arranged closer to the +X direction. In addition, the fine alignment mark 132*x* has, for example, a line-and-space pattern extending in a direction along the Y direction, and has a periodic structure in the X direction. The fine alignment mark 132*y* has, for example, a line-and-space pattern extending in a direction along the X direction, and has a periodic structure in the Y direction.

As illustrated in FIG. 4B, the pattern 12 included in the template 10 is a convex pattern protruding from the contact surface of the template 10 with the resist on the wafer 20. In the example of FIG. 4B, more specifically, the pattern 12 includes a line 121 to be a wiring after transfer to the wafer 20, and a columnar portion 122 that protrudes from the line 121 and is to be a via after transfer to the wafer 20.

By having such a shape, the wiring and the via can be collectively formed on the wafer 20 by transferring the pattern 12. The configuration including the wiring and the via collectively formed as described above is also referred to as a dual damascene structure or the like.

As described above, the fine alignment marks 132*x* and 132*y* have, for example, a line-and-space pattern having a plurality of lines and a plurality of spaces positioned between adjacent lines. That is, in the template 10, a convex portion protruding from the contact surface with the resist on the wafer 20 is a line, and a portion between the convex lines is a space.

A metal film 135 such as a chromium film is disposed on the bottom surface of the space portion of the line-and-space pattern. The metal film 135 has a refractive index different from that of the surrounding quartz member due to the difference in material, and improves the visibility of the fine alignment marks 132*x* and 132*y*.

The rough alignment mark 131 is, for example, a rectangular pad-shaped convex pattern in which the central portion is recessed, and the metal film 135 is arranged in the recessed portion at the center. However, the rough alignment mark 131 may be configured by arranging a line-and-space pattern in which a plurality of lines and a plurality of spaces are combined in a rectangular shape, similarly to the fine alignment marks 132*x* and 132*y*. Also in this case, a metal film is preferably disposed on the bottom surface of the space portion of the line-and-space pattern.

In the example of FIG. 4B, the protrusion height of the rough alignment mark 131 and the fine alignment marks 132*x* and 132*y* from the contact surface of the template 10 is equal to, for example, the protrusion height of the line portion of the pattern 12.

(Configuration Example of Wafer)

Next, a detailed configuration example of the wafer 20 as the processing target by the imprinting device 1 according to the embodiment will be described with reference to FIGS. 5A to 7.

Figures 5A, 5B:
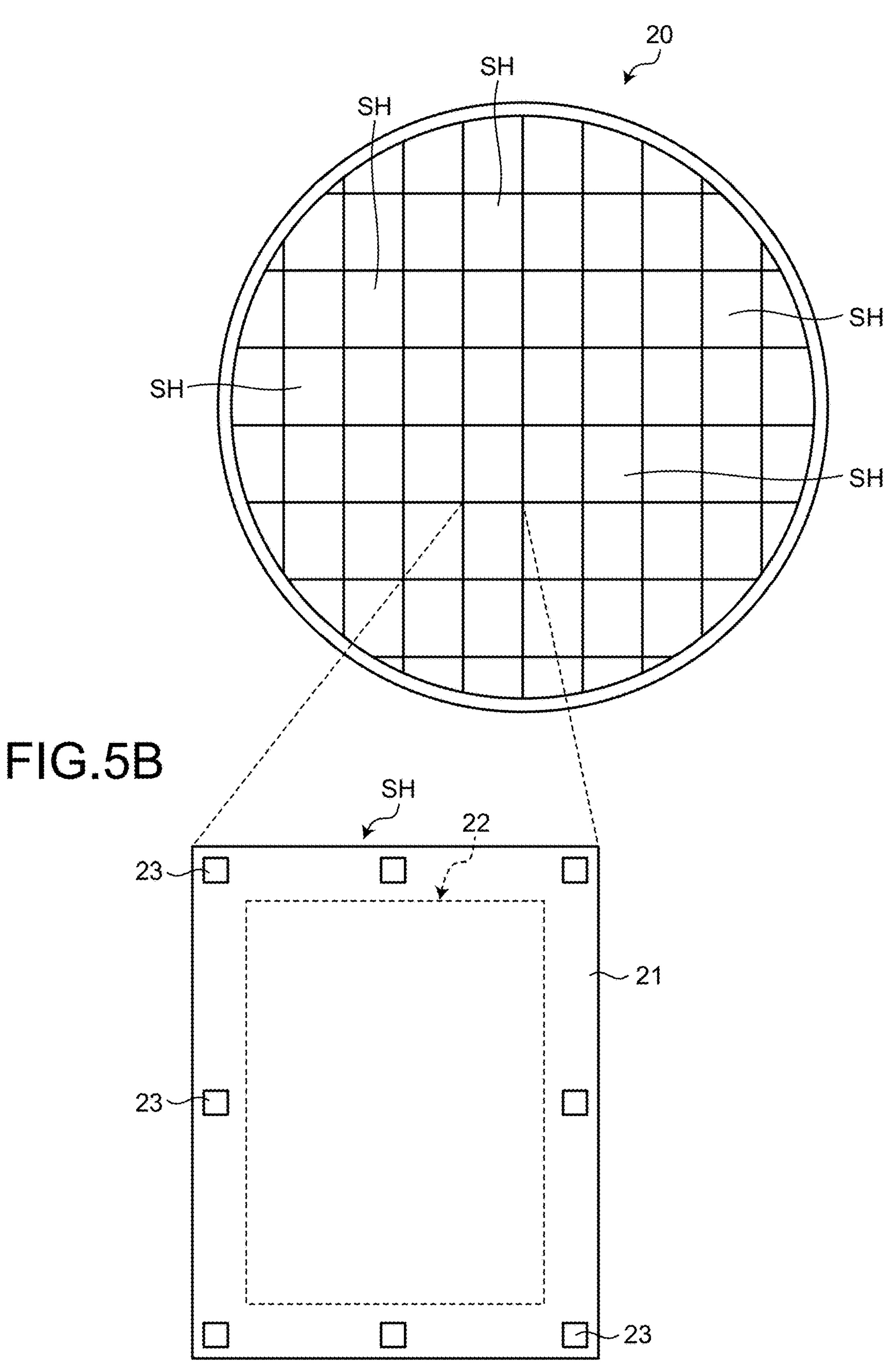
FIGS. 5A and 5B are top views illustrating an example of a configuration of a wafer according to the embodiment.

FIGS. 5A and 5B are top views illustrating an example of a configuration of the wafer 20 according to the embodiment. FIG. 5A is a top view of the wafer 20, and FIG. 5B is an enlarged top view of one shot region SH.

As illustrated in FIG. 5A, an upper surface of the wafer 20 as a substrate or a semiconductor substrate is partitioned into a plurality of shot regions SH. The plurality of shot regions SH has, for example, a rectangular shape, and is arranged in a matrix shape on the entire surface of the wafer 20.

These shot regions SH are regions that become a processing unit per one time in some processes including the imprinting processing among a plurality of manufacturing processes of the semiconductor device. That is, for example, in the imprinting processing described later, processing of transferring the pattern 12 of the template 10 is performed for each shot region SH.

As illustrated in FIG. 5B, each shot region SH has a transfer region 22 to which the pattern 12 of the template 10 is transferred, at the central portion. That is, the transfer region 22 may have an area and a shape substantially equal to the area and the shape of the pattern 12 of the template 10 described above, for example. The transfer region 22 becomes an element region of the semiconductor device after a predetermined process. One or more semiconductor devices are obtained from the element region.

A plurality of alignment marks 23 is provided around the transfer region 22. The alignment mark 23 as a first alignment mark is formed on a film below a processing target film 21 formed on the upper surface of the wafer 20, for example. The processing target film 21 is, for example, a silicon oxide film or the like, and is a film to be processed into a shape corresponding to the pattern 12 of the template 10.

Each alignment mark 23 is used in a pair with the corresponding alignment mark 13 of the template 10 described above, and is used for alignment between the wafer 20 and the template 10.

Figure 6A:
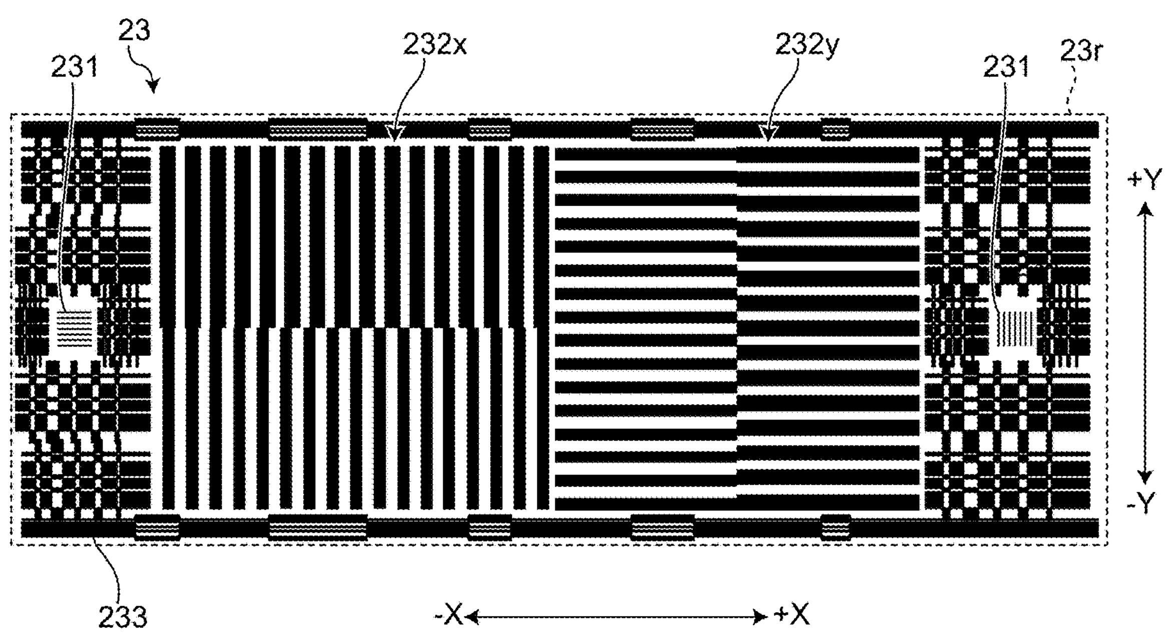
FIGS. 6A and 6B are top views illustrating an example of a configuration of an alignment mark included in the wafer according to the embodiment.
Figure 6B:
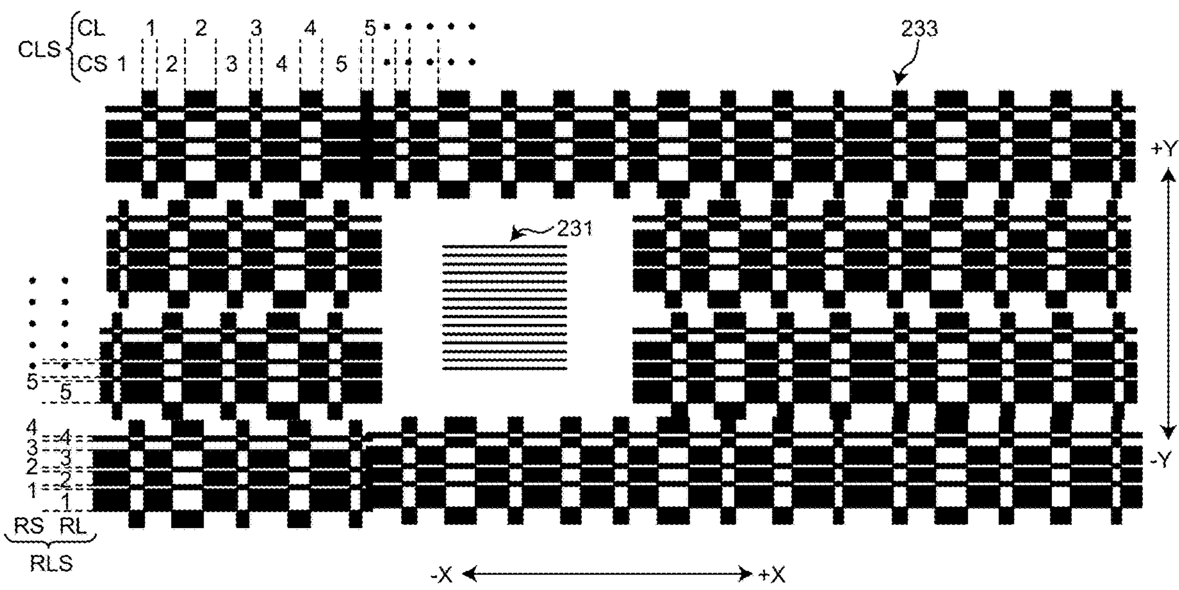

FIGS. 6A and 6B are top views illustrating an example of a configuration of the alignment mark 23 included in the wafer 20 according to the embodiment. FIG. 6A is a top view illustrating an overall configuration of the alignment mark 23, and FIG. 6B is an enlarged top view of a rough alignment mark 231 included in the alignment mark 23 and a peripheral region thereof.

In FIGS. 6A and 6B, the left and right directions on the paper are defined as the −X direction and the +X direction, respectively, and the up and down directions on the paper are defined as the +Y direction and the −Y direction.

As illustrated in FIG. 6A, each alignment mark 23 of the wafer 20 includes a rough alignment mark 231 as a first mark, a fine alignment mark 232*x* as a second mark, a fine alignment mark 232*y*, and an auxiliary pattern 233 as a second pattern.

For example, one rough alignment mark 231 included in the alignment mark 23 is provided at each of both end portions in the mark region 23*r* where the alignment mark 23 is provided, in the X direction. That is, in the mark region 23*r*, the rough alignment mark 231 is arranged at a position corresponding to the rough alignment mark 131 of the template 10.

More specifically, in a case where the template 10 and the wafer 20 are arranged to face each other such that the alignment marks 13 and 23 of the template 10 and the wafer 20 overlap each other in the up and down direction, the rough alignment mark 231 of the wafer 20 is arranged in the mark region 23*r* so as to be positioned between the pair of rough alignment marks 131 arranged in the Y direction of the template 10.

In the alignment marks 13 and 23 of the template 10 and the wafer 20, the alignment marks being provided at positions corresponding to each other, the rough alignment marks 131 and 231 are used in pairs in a case of roughly aligning the template 10 and the wafer 20.

The fine alignment mark 232*x* included in the alignment mark 23 has a periodic structure having a period different from that of the fine alignment mark 132*x* of the template 10 in the X direction. The fine alignment mark 232*y* has a periodic structure having a period different from that of the fine alignment mark 132*y* of the template 10 in the Y direction.

The fine alignment marks 232*x* and 232*y* are provided, for example, between the rough alignment marks 231 at both end portions in the X direction. In the example of FIG. 6A, the fine alignment marks 232*x* and 232*y* are arranged side by side in the X direction, the fine alignment mark 232*x* is arranged closer to the −X direction, and the fine alignment mark 232*y* is arranged closer to the +X direction. That is, in the mark region 23*r*, the fine alignment marks 232*x* and 232*y* are arranged at positions respectively corresponding to the fine alignment marks 132*x* and 132*y* of the template 10.

More specifically, in a case where the template 10 and the wafer 20 are arranged to face each other such that the alignment marks 13 and 23 of the template 10 and the wafer 20 overlap each other in the up and down direction, the fine alignment mark 232*x* of the wafer 20 overlaps the fine alignment mark 132*x* of the template 10 in the up and down direction, and the fine alignment mark 232*y* of the wafer 20 overlaps the fine alignment mark 132*y* of the template 10 in the up and down direction.

In the alignment marks 13 and 23 of the template 10 and the wafer 20, the alignment marks being provided at positions corresponding to each other, the fine alignment marks 132*x* and 232*x* are used in pairs in a case of precisely aligning the template 10 and the wafer 20 in the X direction. The fine alignment marks 132*y* and 232*y* are used in pairs in a case of precisely aligning the template 10 and the wafer 20 in the Y direction.

The auxiliary pattern 233 included in the alignment mark 23 is arranged to surround each of the rough alignment marks 231 at both end portions in the X direction, for example. More preferably, as in the example illustrated in FIG. 6A, the auxiliary pattern 233 is arranged in the entire mark region 23*r* excluding a region where the rough alignment marks 231 and the fine alignment marks 232*x* and 232*y* are arranged.

As illustrated in FIG. 6B, the auxiliary pattern 233 has a configuration in which, for example, a line-and-space pattern RLS extending in a direction along the X direction and a line-and-space pattern CLS extending in a direction along the Y direction are combined.

In addition, the line-and-space pattern RLS includes a plurality of lines RL (RL1, RL2, RL3, . . . ) extending in a direction along the X direction, and a plurality of spaces RS (RS1, RS2, RS3, . . . ) positioned between the lines RL adjacent to each other. In addition, the line-and-space pattern CLS includes a plurality of lines CL (CL1, CL2, CL3, . . . ) extending in a direction along the Y direction, and a plurality of spaces CS (CS1, CS2, CS3, . . . ) positioned between the lines CL adjacent to each other.

Both the line-and-space pattern RLS as a first line-and-space pattern, and the line-and-space pattern CLS as a second line-and-space pattern have random dimensional distribution.

More specifically, in the line-and-space pattern RLS, the widths and pitches of the plurality of lines RL in the Y direction and the widths and pitches of the plurality of spaces RS in the Y direction vary randomly without regularity, for example. That is, each of the widths and pitches of the plurality of lines RL in the Y direction and the widths and pitches of the plurality of spaces RS in the Y direction varies by taking a dispersed value. Similarly, also in the line-and-space pattern CLS, the widths and pitches of the plurality of lines CL in the X direction and the widths and pitches of the plurality of spaces CS in the X direction vary randomly without regularity, for example. That is, each of the widths and pitches of the plurality of lines CL in the X direction and the widths and pitches of the plurality of spaces CS in the X direction varies by taking a dispersed value.

In addition, in portions where the lines RL and CL of the respective line-and-space patterns RLS and CLS intersect with each other, spaces RS and CS are arranged instead of the lines RL and CL. More specifically, the space at the intersection of the lines RL and CL corresponds to the space RS in the line-and-space pattern RLS, and corresponds to the space CS in the line-and-space pattern CLS.

In addition, the dimensional distribution of auxiliary pattern 233 is within a range of equal to or greater than the minimum dimension and equal to or lower than the maximum dimension of the partial configuration of the semiconductor device arranged in the layer where auxiliary pattern 233 is arranged. Further, the auxiliary pattern 233 preferably has a dimensional distribution centered on an intermediate value of the dimension of the partial configuration of the semiconductor device of the same layer. In addition, it is preferable that the standard deviation of the distribution is a value that is half of the difference between the minimum value and the maximum value of the dimension of the partial configuration of the semiconductor device.

That is, in this case, the dimensional distribution of the auxiliary pattern 233 has a statistical dimensional distribution such as a normal distribution having a peak at the intermediate value of the dimension of the partial configuration of the semiconductor device. However, the dimensional distribution of the auxiliary pattern 233 does not necessarily have a normal distribution, and may have an arbitrary distribution having an intermediate value of the dimension of the partial configuration of the semiconductor device as a central value.

Here, in the manufacturing process of the semiconductor device, various films are stacked on the wafer 20, and a partial configuration of the semiconductor device is appropriately formed in the films. Each of these films or a plurality of films close to each other in the stacking direction may correspond to one layer. That is, the semiconductor device has a plurality of layers arranged in the stacking direction of various films, that is, in the Z direction.

Different partial configurations of the semiconductor device are arranged in a plurality of layers included in the semiconductor device. For example, a transistor or the like can be arranged immediately above the wafer 20 which is a silicon substrate or the like. Furthermore, in the layer immediately above the transistor, for example, a contact connected to the transistor, a wiring connected to the contact, and the like are arranged. Furthermore, in a further upper layer, a wiring such as local interconnect or global connect, a via connecting the wirings between different layers, and the like are arranged.

Therefore, the layer in which the auxiliary pattern 233 described above is disposed is a film in which the auxiliary pattern 233 is formed, or is a plurality of films within a predetermined range in the stacking direction including the film in which the auxiliary pattern 233 is formed. Furthermore, the dimensions such as the minimum dimension and the maximum dimension of the partial configuration of the semiconductor device described above can be, for example, dimensions such as a gate length and a gate width of the transistor, a pitch between a plurality of gates, a wiring width, a pitch between a plurality of wirings, and diameters of the contact and the via.

A partial configuration of the semiconductor device arranged in the same layer as the auxiliary pattern 233 is an example of the actual pattern.

Such an auxiliary pattern 233 can be designed by randomly determining the widths and pitches of the plurality of lines RL and CL, and the widths and pitches of the plurality of spaces RS and CS. In this case, a condition may be imposed such that the numerical values are determined within a range of equal to or greater than the minimum dimension and equal to or less than the maximum dimension of the partial configuration of the semiconductor device, and such that the standard deviation is a value that is half of the difference between the minimum dimension and the maximum dimension with the intermediate value of the dimension of the partial configuration of the semiconductor device as the center.

As described above, by determining the dimensional distribution of the auxiliary pattern 233, the auxiliary pattern 233 can be configured according to the design rule of the semiconductor device.

In order to form the auxiliary pattern 233 designed as described above on the wafer 20, for example, imprinting processing can be used.

Figure 7:
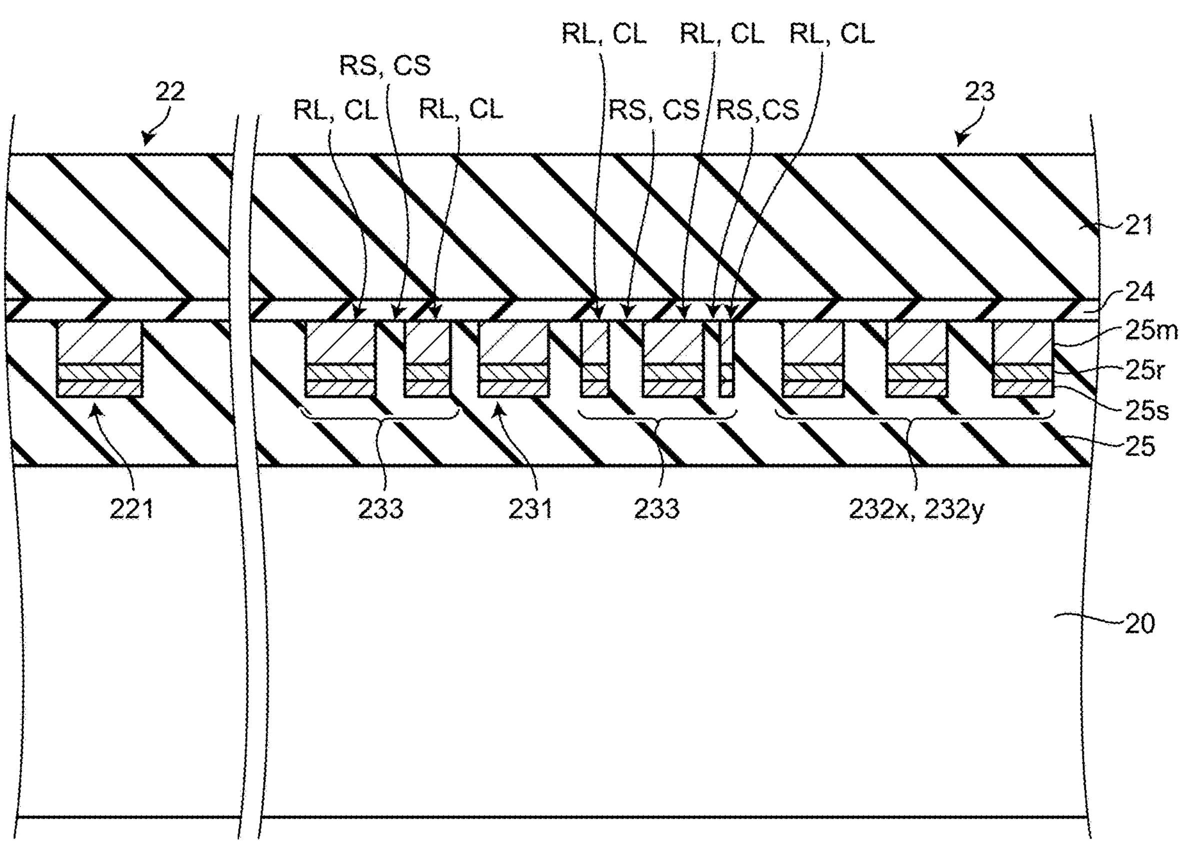
FIG. 7 is a cross-sectional view illustrating an example of a configuration of an alignment mark and a transfer region included in the wafer according to the embodiment.

FIG. 7 is a cross-sectional view illustrating an example of a configuration of the alignment mark 23 and the transfer region 22 included in the wafer 20 according to the embodiment.

As illustrated in FIG. 7, for example, a lower layer film 25, a base film 24, and the processing target film 21 are formed in this order on the wafer 20 according to the embodiment as a target of the imprinting processing. The lower layer film 25 and the processing target film 21 are, for example, dense silicon oxide films such as densified Tetra Ethyl Ortho Silicate (dTEOS) films. The base film 24 is a thin silicon oxide film formed by, for example, plasma chemical vapor deposition (CVD) using silane ($SiH_4$) or the like as a raw material.

The lower layer film 25, the base film 24, and the processing target film 21 are substantially transparent films having transparency to, for example, ultraviolet light from the light source 89 used in the imprinting processing and light from the light source 861 that is illumination light of the alignment marks 13 and 23.

In the example of FIG. 7, the alignment mark 23 is arranged in the lower layer film 25 among the lower layer film 25, the base film 24, and the processing target film 21.

That is, in the lower layer film 25 as a first film, the rough alignment mark 231, the fine alignment marks 232*x* and 232*y*, and the auxiliary pattern 233 protruding from the surface of the lower layer film 25 in contact with the base film 24 to the inside of the lower layer film 25 are arranged. In addition, in a region of the lower layer film 25 overlapping the transfer region 22 of the processing target film 21 in the up and down direction, a wiring 221 protruding from the surface of the lower layer film 25 to the inside of the lower layer film 25 is arranged. Here, the wiring 221 is a partial configuration of the semiconductor device arranged in the same layer as the auxiliary pattern 233, and is an example of the actual pattern.

The rough alignment mark 231, the fine alignment marks 232*x* and 232*y*, the auxiliary pattern 233, and the wiring 221 have a stacked structure in which, for example, a sputtering film 25*s*, a barrier metal film 25*r*, and a metal film 25*m* are stacked in this order from the inside of the lower layer film 25 toward the surface of the lower layer film 25.

The sputtering film 25*s* is, for example, a titanium film formed by sputtering. The barrier metal film 25*r* is a titanium nitride film or the like, and suppresses diffusion of the metal film 25*m* to the inside of the lower layer film 25. The metal film 25*m* is a tungsten film or the like, and functions as a substantial wiring portion in the wiring 221. In addition, the metal film 25*m* such as a tungsten film has a refractive index different from that of the surrounding lower layer film 25 due to the difference in material, and improves the visibility of the alignment mark 23.

In the auxiliary pattern 233 of the alignment mark 23, a stacked structure portion of the sputtering film 25*s*, the barrier metal film 25*r*, and the metal film 25*m* protruding to the inside of the lower layer film 25 corresponds to the lines RL and CL in the above-described line-and-space patterns RLS and CLS. In addition, the portions between the stacked structures of the sputtering film 25*s*, the barrier metal film 25*r*, and the metal film 25*m* arranged in the lower layer film 25 corresponds to the spaces RS and CS.

The same applies to the fine alignment marks 232*x* and 232*y* having periodicity in the X direction and the Y direction, respectively. The line-and-space of the fine alignment marks 232*x* and 232*y* also has a stacked structure portion of the sputtering film 25*s*, the barrier metal film 25*r*, and the metal film 25*m* to be line portions, and a portion to be a space portion therebetween.

In addition, the rough alignment mark 231 is, for example, a rectangular pad-shaped convex pattern, but may be configured by arranging a line-and-space pattern in which a plurality of lines and a plurality of spaces are combined in a rectangular shape, similarly to the fine alignment marks 232*x* and 232*y*.

As described above, the dimensional distribution of the auxiliary pattern 233 is determined based on, for example, the dimension of the partial configuration of the semiconductor device arranged in the same layer as the auxiliary pattern 233. Therefore, in a case where the auxiliary pattern 233 is arranged in the lower layer film 25 as in the example of FIG. 7, the dimension of the wiring 221 similarly arranged in the lower layer film 25 serves as a reference in determining the dimensional distribution of the auxiliary pattern 233.

Alternatively, in a case where the lower layer film 25 in which the auxiliary pattern 233 is arranged is sufficiently close to the processing target film 21, such as being a film immediately below the processing target film 21, the processing target film 21 may be included in the same layer as the auxiliary pattern 233 as described above. In this case, the dimension of the partial configuration of the semiconductor device to be formed later on processing target film 21 may be used as a reference in determining the dimensional distribution of the auxiliary pattern 233. Furthermore, the dimension of the pattern 12 of the template 10, which becomes a partial configuration of the semiconductor device in the processing target film 21, can be used as a reference in determining the dimensional distribution of the auxiliary pattern 233.

(Method for Manufacturing Semiconductor Device)

Next, a method for manufacturing the semiconductor device according to the embodiment will be described with reference to FIGS. 8A to 12. The manufacturing process of the semiconductor device of the embodiment includes the imprinting processing by the imprinting device 1 described above.

FIGS. 8A to 11C are cross-sectional views sequentially illustrating a part of the procedure of the method for manufacturing the semiconductor device according to the embodiment.

In FIGS. 8A to 11C, the processing illustrated in FIGS. 8A to 11A illustrates an example of the procedure of the imprinting method by the imprinting device 1. The processing illustrated in FIGS. 8A to 11A is also a pattern forming method for forming the pattern 12 of the template 10 on a resist film 40 formed on the wafer 20. As described above, the imprinting processing and the pattern forming processing by the imprinting device 1 are performed as one process of the manufacturing process of the semiconductor device.

As described above, for example, the lower layer film 25, the base film 24, and the processing target film 21 may be formed on the wafer 20 as a target of the imprinting processing, and the wiring 221 and the like may be formed on the lower layer film 25. However, in FIGS. 8A to 11C, illustration of the partial configuration of the lower layer film 25, the base film 24, the wiring 221, and the like is omitted.

Figure 8A:
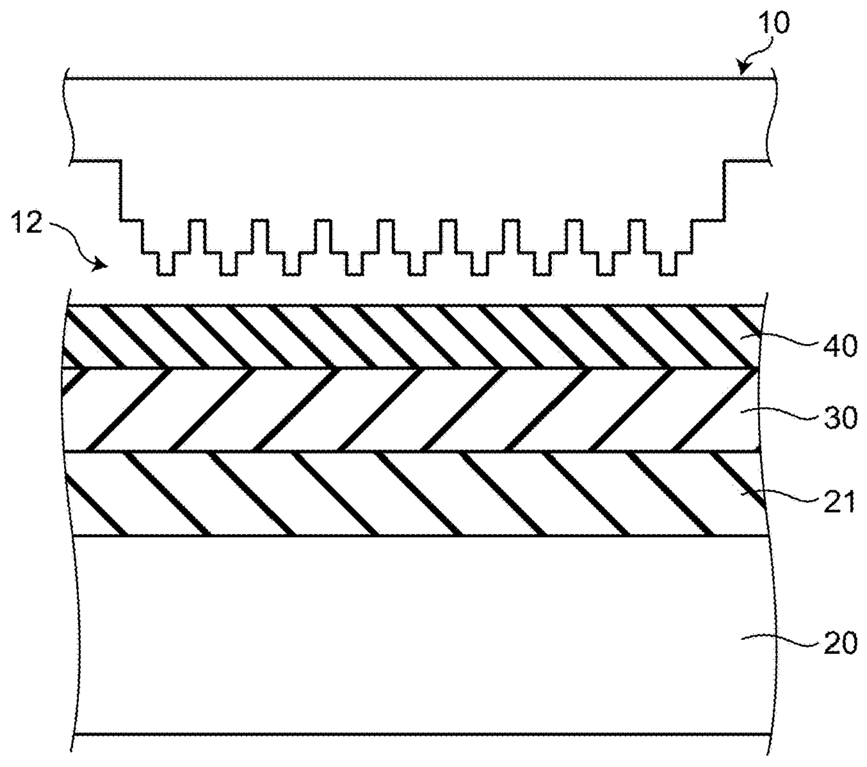
FIGS. 8A and 8B are cross-sectional views sequentially illustrating a part of a procedure of a method for manufacturing a semiconductor device according to the embodiment.

As illustrated in FIG. 8A, for example, a spin on carbon (SOC) film 30 is formed on the processing target film 21 of the wafer 20 in the imprinting processing. The SOC film 30 is an organic film mainly composed of carbon, and is formed by a spin coating method or the like.

In this manner, the wafer 20 on which the SOC film 30 is formed is carried into the imprinting device 1 by a conveyance mechanism (not illustrated), and is placed and sucked on the wafer chuck 82*b* of the imprinting device 1.

In addition, the template 10 having the pattern 12 to be transferred to the wafer 20 as the processing target is carried into the imprinting device 1 by a conveyance mechanism (not illustrated), and is mounted to the template chuck 812 of the imprinting device 1.

In addition, the wafer stage 82 holding the wafer 20 is moved below the liquid dropping device 87. The liquid dropping device 87 drops the resist on the SOC film 30 in the shot region SH where the imprinting processing is to be performed, among the plurality of shot regions SH, using the inkjet method.

The resist dropped from the liquid dropping device 87 is, for example, an organic material such as a photocurable resist that is cured by irradiation with ultraviolet light or the like. In a case where the resist is dropped from the liquid dropping device 87, the resist is an uncured liquid.

As a result, the resist film 40 as a resin film is formed on the SOC film 30 in one shot region SH. However, the uncured resist film 40 formed by the inkjet method may be arranged in a droplet shape in the shot region SH, regardless of the example of FIG. 8A.

As described above, the resist film 40 may be formed by applying the resist using a spin coating method or the like. In this case, the resist film 40 is formed substantially uniformly on the entire surface of the wafer 20.

The wafer stage 82 holding the wafer 20 is moved, so that the shot region SH where the imprinting processing is to be performed is arranged below the template 10 held on the template stage 81 of the imprinting device 1.

Figure 8B:
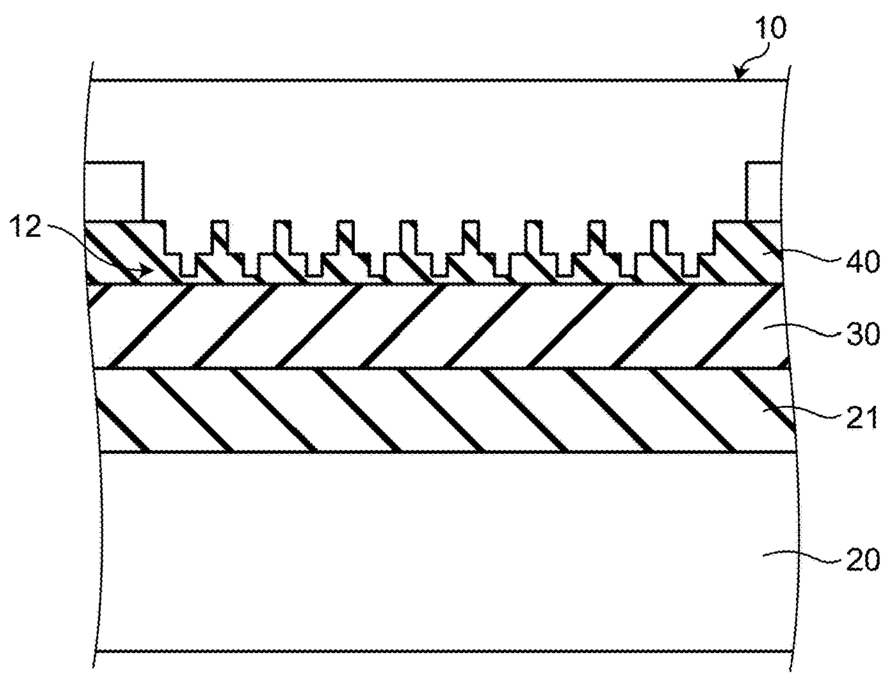

As illustrated in FIG. 8B, the template stage 81 is lowered, so that the pattern 12 of the template 10 is pressed against the resist film 40 of the wafer 20.

In this case, the drive unit 814 adjusts the lowering position of the template stage 81 such that a predetermined gap is formed between the template 10 and the SOC film 30 of the wafer 20. This prevents the template 10 and the wafer 20 from interfering with each other.

As described above, in a state where the pattern 12 is in contact with the resist film 40, the plurality of alignment marks 13 provided on the template 10 is observed by the imaging elements 83 of the imprinting device 1, and the contact state between the pattern 12 and the resist film 40 is maintained until the uneven portion of the alignment mark 13 is filled with the resist film 40. Meanwhile, the uneven portion of the pattern 12 of the template 10 is also filled with the resist film 40.

Since the uneven portion of the alignment mark 13 is filled with the resist film 40, the visibility of the alignment mark 23 of the wafer 20 viewed through the alignment mark 13 and the template 10 is improved.

Therefore, after the filling of the resist film 40, the control unit 90 of the imprinting device 1 roughly aligns the positions of the template 10 and the wafer 20 in a direction along the plane direction, that is, the positions in the X direction and the Y direction while observing the rough alignment marks 131 and 231 of the template 10 and the wafer 20 by the imaging elements 84*a* to 84*d*, for example.

In this case, for example, while appropriately switching the imaging elements 84*a* to 84*d* to be used, the fine alignment marks 132*x*, 132*y*, 232*x*, and 232*y* at positions corresponding to each other are observed, and alignment thereof is appropriately performed.

In this case, it is preferable to perform the alignment of the template 10 and the wafer 20 using the alignment marks 13 and 23 as far as possible from each other, such as four corners of the shot region SH among the alignment marks 13 and 23 present in the shot region SH. Accordingly, the alignment with the pattern 12 of the template 10 can be accurately performed over the entire shot region SH.

In the alignment of the rough alignment marks 131 and 231, ideally, the pair of rough alignment marks 131 arranged on one side in the X direction and the rough alignment mark 231 of the wafer 20 are aligned in a line in the Y direction so that the positions in the X direction are aligned. In addition, the rough alignment mark 231 of the wafer 20 is arranged at the center position of the pair of rough alignment marks 131 in the Y direction, the pair of rough alignment marks being arranged on one side in the X direction, and thereby the positions in the Y direction are aligned.

In this manner, the alignment using the rough alignment marks 131 and 231 is also referred to as rough inspection, rough alignment, or the like. In practice, a predetermined alignment error is allowed to occur between the template 10 and the wafer 20 in both the X direction and the Y direction.

In a case where the rough alignment is performed, at least one of the wafer stage 82 and the template stage 81 may rotate at least one of the wafer 20 and the template 10 in an in-plane rotation direction to perform the alignment of the shot region SH and the pattern 12 in a rotation direction.

Figures 9A, 9B, 9C:
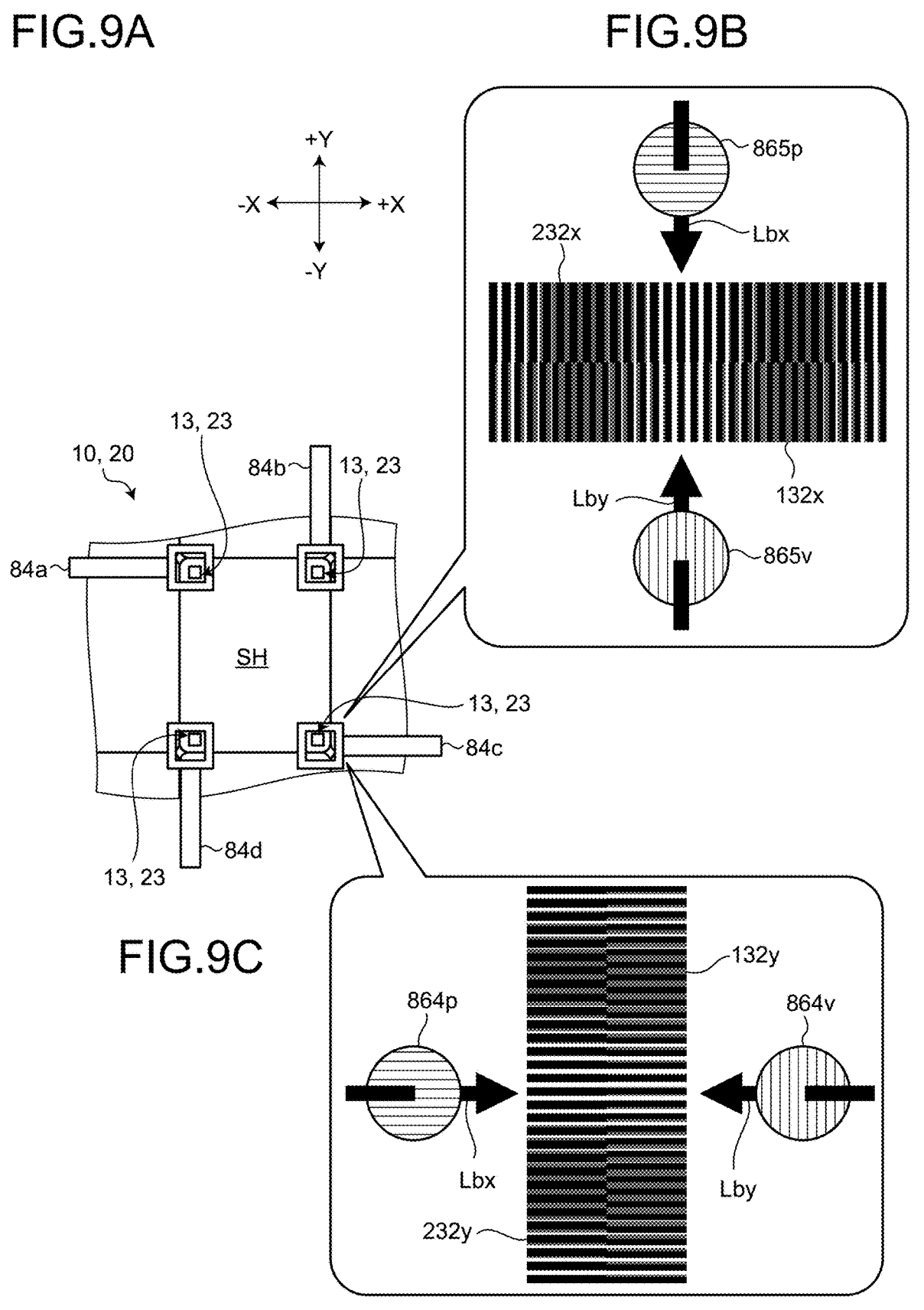

As illustrated in FIG. 9A, after the rough alignment is completed, the alignment of the wafer 20 and the template 10 in a direction along the surface of the wafer 20 is performed while observing the individual fine alignment marks 132*x* and 132*y* of the template 10 and the individual fine alignment marks 232*x* and 232*y* of the wafer 20 corresponding thereto by the imaging elements 84*a* to 84*d*.

In the example of FIG. 9A, the control unit 90 causes the imaging element 84*a* to image the alignment marks 13 and 23 at the upper left corner of the rectangular shot region SH on the paper, causes the imaging element 84*b* to image the alignment marks 13 and 23 at the upper right corner of the shot region SH on the paper, causes the imaging element 84*c* to image the alignment marks 13 and 23 at the lower right corner of the shot region SH on the paper, and causes the imaging element 84*d* to image the alignment marks 13 and 23 at the lower left corner of the shot region SH on the paper.

In this case, for example, while appropriately switching the imaging elements 84*a* to 84*d* to be used, the fine alignment marks 132*x*, 132*y*, 232*x*, and 232*y* at positions corresponding to each other are observed, and alignment thereof is appropriately performed.

In this case, it is preferable to perform the alignment of the template 10 and the wafer 20 using the alignment marks 13 and 23 as far as possible from each other, such as four corners of the shot region SH among the alignment marks 13 and 23 present in the shot region SH, by utilizing all the imaging elements 84*a* to 84*d* included in the imprinting device 1, for example. Accordingly, the alignment with the pattern 12 of the template 10 can be accurately performed over the entire shot region SH.

As illustrated in FIG. 9B, in a case where the alignment in the X direction is performed using the fine alignment marks 232*x* and 132*x*, the observation of the fine alignment marks 232*x* and 132*x* is performed by using the light Lbx and Lby transmitted through the polarizing filters 865*p* and 865*v* arranged on the polarizing plate 863 in the Y direction, as illumination light, by the illumination system 86*b* of the imprinting device 1.

As described above, the fine alignment marks 232*x* and 132*x* have, for example, a line-and-space pattern extending in a direction along the Y direction. As described above, by illuminating the fine alignment marks 232*x* and 132*x* from both sides in the Y direction along the extending direction of the pattern of the fine alignment marks 232*x* and 132*x*, the position detection accuracy of the fine alignment marks 232*x* and 132*x* can be enhanced.

As illustrated in FIG. 9C, in a case where the alignment in the Y direction is performed using the fine alignment marks 232*y* and 132*y*, the observation of the fine alignment marks 232*y* and 132*y* is performed by using the light Lbx and Lby transmitted through the polarizing filters 864*p* and 864*v* arranged on the polarizing plate 863 in the X direction, as illumination light, by the illumination system 86*b* of the imprinting device 1.

As described above, the fine alignment marks 232*y* and 132*y* have, for example, a line-and-space pattern extending in a direction along the X direction. As described above, by illuminating the fine alignment marks 232*y* and 132*y* from both sides in the X direction along the extending direction of the pattern of the fine alignment marks 232*y* and 132*y*, the position detection accuracy of the fine alignment marks 232*y* and 132*y* can be enhanced.

Figures 10A, 10B, 10C, 10D:
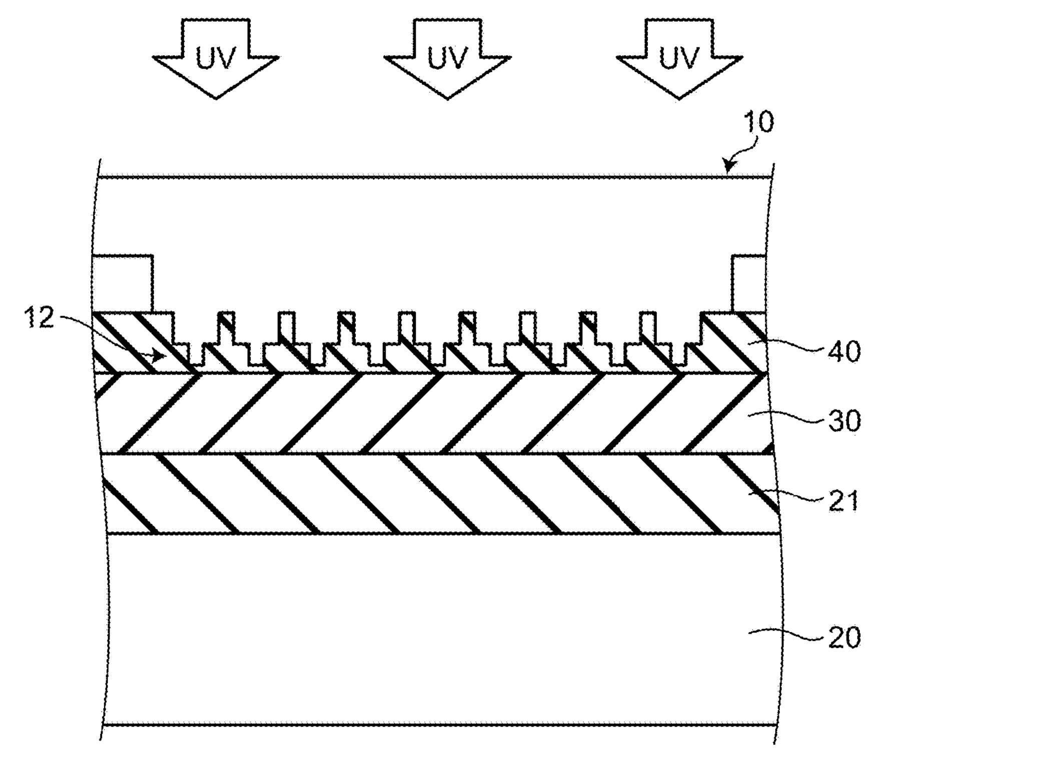
FIGS. 10A to 10D are cross-sectional views sequentially illustrating a part of the procedure of the method for manufacturing the semiconductor device according to the embodiment.

FIGS. 10A to 10C are images of the fine alignment marks 132*x* and 232*x* captured by any of the imaging elements 84*a* to 84*d*, and illustrate a state in which alignment between the wafer 20 and the template 10 is performed using the fine alignment marks 132*x* and 232*x*. Note that in FIGS. 10A to 10C, the left and right directions on the paper are defined as a −X direction and a +X direction, respectively.

As described above, the cycle of the fine alignment mark 132*x* of the template 10 in the X direction is slightly different from the cycle of the fine alignment mark 232*x* of the wafer 20 in the X direction. With such a configuration, in a case where the fine alignment marks 132*x* and 232*x* overlap each other vertically, an interference fringes called moire are generated. In a case where the relative position between the template 10 and the wafer 20 is moved in the X direction in a state where the fine alignment marks 132*x* and 232*x* overlap each other, the interference fringes are moved in the X direction.

FIG. 10A illustrates a state in which the template 10 is shifted in the −X direction with respect to the wafer 20. FIG. 10B illustrates a state in which the template 10 is shifted in the +X direction with respect to the wafer 20. FIG. 10C illustrates a state in which the positional deviation amount between the wafer 20 and the template 10 in the X direction is zero.

For example, in the image captured by the imaging element 84 described above, the movement of such interference fringes is detected as a signal waveform, and processed using a least squares method or the like, and thereby the positional deviation amount between the template 10 and the wafer 20 in the X direction can be calculated.

In addition, the alignment of the wafer 20 and the template 10 in the Y direction can be similarly performed using the fine alignment marks 132*y* and 232*y*. That is, while the fine alignment marks 132*y* and 232*y* are observed by the corresponding imaging elements 84*a* to 84*d*, the relative position between the template 10 and the wafer 20 is moved in the Y direction, the movement of the interference fringes is detected as a signal waveform, and thereby the positional deviation amount between the template 10 and the wafer 20 in the Y direction is calculated.

As described above, for example, by detecting and analyzing the interference fringes in the fine alignment marks 132*x* and 232*x* and the fine alignment marks 132*y* and 232*y* as electric signals, the positional deviation amount between the template 10 and the wafer 20 can be quantified with higher accuracy, and the alignment between the template 10 and the wafer 20 can be performed with higher accuracy.

In this manner, the alignment using the fine alignment marks 132*x* and 232*x* and the fine alignment marks 132*y* and 232*y* is also referred to as precise alignment, fine alignment, or the like. In addition, the fine alignment marks 132*x*, 232*x*, 132*y*, and 232*y* that generate such interference fringes are also referred to as moiré alignment marks or the like.

In a case where the fine alignment is performed, at least one of the wafer stage 82 and the template stage 81 may rotate at least one of the wafer 20 and the template 10 in an in-plane rotation direction to perform the alignment of the shot region SH and the pattern 12 in a rotation direction.

Even in the fine alignment using the fine alignment marks 132*x*, 232*x*, 132*y*, and 232*y*, actually, a predetermined alignment error may occur between the template 10 and the wafer 20 in both the X direction and the Y direction. Even in this case, a positional deviation amount of a predetermined amount or less is allowed in the imprinting processing.

Therefore, in the actual alignment operation, for example, a period during which the alignment operation is performed may be set in advance, and the alignment operation may be ended when a predetermined time is reached. Alternatively, upper limit values of the positional deviation amounts of the fine alignment marks 132*x* and 232*x* and the fine alignment marks 132*y* and 232*y* in the X direction and the Y direction may be set in advance, and the alignment operation may be ended when the positional deviation amount becomes equal to or less than the upper limit value.

Alternatively, both an operation period of the alignment and a threshold of the alignment error may be determined in advance, and the alignment operation may be ended when the alignment error becomes equal to or less than the threshold, or when a timeout occurs after the operation period of the alignment has elapsed.

As illustrated in FIG. 10D, after the alignment between the wafer 20 and the template 10 is ended, the resist film 40 is irradiated with ultraviolet light through the template 10 while the positions of the wafer 20 and the template 10 are maintained. As a result, the resist film 40 is cured in a state where the uneven portion of the pattern 12 is filled with the resist film.

Figure 11A:
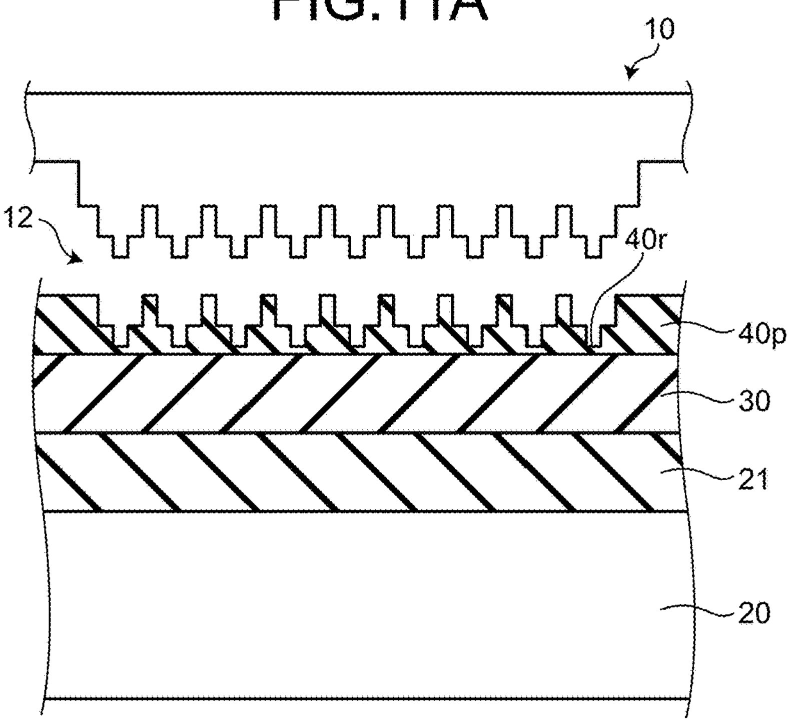
FIGS. 11A to 11C are cross-sectional views sequentially illustrating a part of the procedure of the method for manufacturing the semiconductor device according to the embodiment.

As illustrated in FIG. 11A, the template 10 is raised by the drive unit 814 provided in the template stage 81. In this case, since the wafer 20 is sucked by the wafer chuck 82*b*, the template 10 can be released from the wafer 20 without peeling the wafer 20 from the wafer stage 82.

As a result, a resist pattern 40*p* to which the pattern 12 of the template 10 is transferred is formed. A thin film called a resist residual film 40*r* is formed at the bottom portion of the pattern of the resist pattern 40*p*. This is because the template 10 is pressed against the wafer 20 in a state where there is a gap between the template 10 and the wafer 20 in order to suppress the contact between the template 10 and the wafer 20 as described above.

As described above, the imprinting processing by the imprinting device 1 according to the embodiment is ended.

Figure 11B:
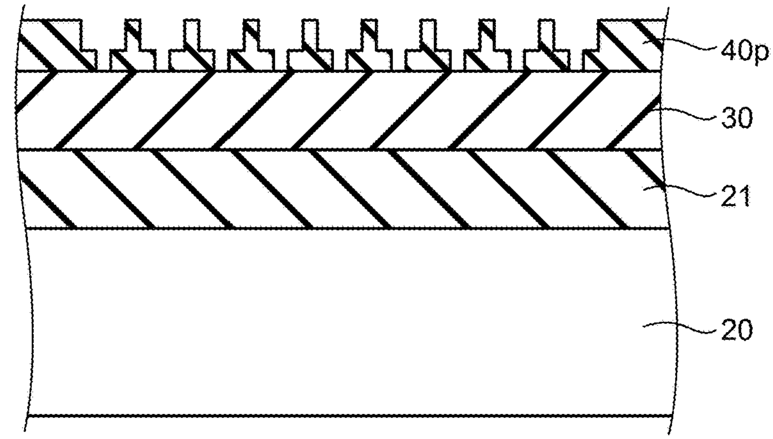

As illustrated in FIG. 11B, the entire surface of the resist pattern 40*p* is processed by processing using, for example, oxygen plasma, and the resist residual film 40*r* at the bottom portion of the pattern is removed. As a result, the surface of the SOC film 30 is exposed at bottom portion of the pattern.

Figure 11C:
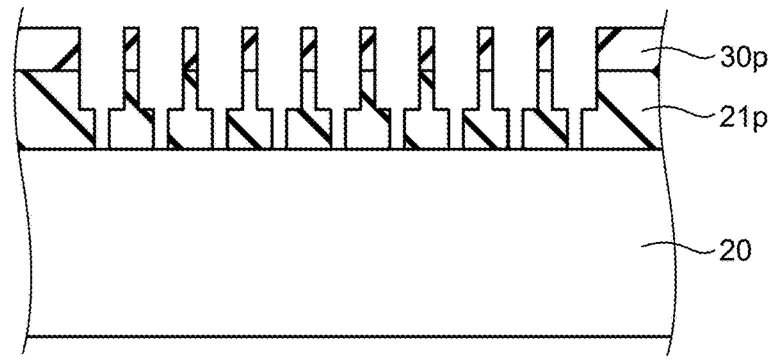

As illustrated in FIG. 11C, by etching the SOC film 30 through the resist pattern 40*p*, a SOC film pattern 30*p* in which the resist pattern 40*p* is transferred to the SOC film 30 is formed. By etching the processing target film 21 through the SOC film pattern 30*p*, a processing target film pattern 21*p* in which the SOC film pattern 30*p* is transferred to the processing target film 21 is formed.

For example, in a case where the pattern 12 of the template 10 includes the line 121 and the columnar portion 122 as described above, the processing target film pattern 21*p* includes a trench pattern and a via hole pattern in which the wiring material and the via material are embedded later.

Thereafter, for example, a metal film such as tungsten or copper is embedded in the processing target film pattern 21*p*, and thereby a desired structure to be a part of the semiconductor device is obtained. In the above example, a dual damascene structure in which the metal film is embedded in the trench pattern and the via hole pattern, and the wiring and the via are collectively formed is formed as a partial configuration of the semiconductor device. The dual damascene structure formed in the processing target film 21 corresponds to a partial configuration of the semiconductor device, and is an example of an actual pattern.

In this case, for example, the via of the dual damascene structure of the processing target film pattern 21*p* is connected to the wiring 221 that has been formed in the lower layer film 25 (not illustrated).

In the imprinting processing of the embodiment, by the precise alignment using the alignment marks 13 and 23, the overlapping accuracy of the pattern 12 with respect to the wafer 20 is improved, and for example, the wiring 221 of the lower layer film 25 and the via of the processing target film pattern 21*p* are more reliably connected.

In a case where the pattern 12 of the template 10 is transferred to the processing target film 21 via the resist film 40 and the SOC film 30 on the wafer 20, the alignment mark 13 can also be transferred to the processing target film 21. However, the protrusion height of the alignment mark 13 is, for example, the protrusion height of the line 121 lower than the columnar portion 122 of the pattern 12. For this reason, the alignment mark 13 transferred to the processing target film 21 is prevented from being conducted with other configurations of the wafer 20 formed on the base film 24 or the lower layer film 25 below the processing target film 21.

In addition, since the alignment mark 13 is originally transferred to a position deviated from the element region of the wafer 20, it is difficult to consider that the alignment mark is conducted with a partial configuration of the semiconductor device formed on the wafer 20. For example, even in a case where the alignment mark 13 penetrates the processing target film 21 to come into contact with the alignment mark 23 or the like of the wafer 20 formed in the lower layer film 25, the alignment mark 23 itself is in a floating state having no electrical conduction with other configurations, and therefore, the electrical characteristics of the semiconductor device are not affected.

Thereafter, the semiconductor device according to the embodiment is manufactured by further forming various films on the wafer 20 and repeatedly performing a predetermined process on the films.

Meanwhile, for the alignment of the template 10 and the wafer 20 using the alignment marks 13 and 23, as described above, the rough alignment using the rough alignment marks 131 and 231 is performed prior to the fine alignment using the fine alignment marks 132*x*, 132*y*, 232*x*, and 232*y*. In this case, also in the rough alignment, similarly to the above-described fine alignment, bipolar illumination by asymmetrically polarized light of the illumination system 86*b* is used.

More specifically, the light Lbx and Lby transmitted through the polarizing filters 865*p* and 865*v* arranged in the Y direction on the polarizing plate 863 or the polarizing filters 864*p* and 864*v* arranged in the X direction is used as the illumination light for the rough alignment marks 131 and 231.

As described above, the lower layer film 25 on which the rough alignment mark 231 is disposed may be a film or the like having optical transparency. In a case where bipolar illumination by asymmetrically polarized light is used for the rough alignment marks 131 and 231 as described above, multiple reflection of illumination light may occur in the lower layer film 25 positioned below the rough alignment marks 131 and 231. In the alignment mark 23 of the embodiment, the auxiliary pattern 233 is arranged at least in a peripheral region of the rough alignment mark 231 to suppress multiple reflection in the lower layer film 25.

Figure 12:
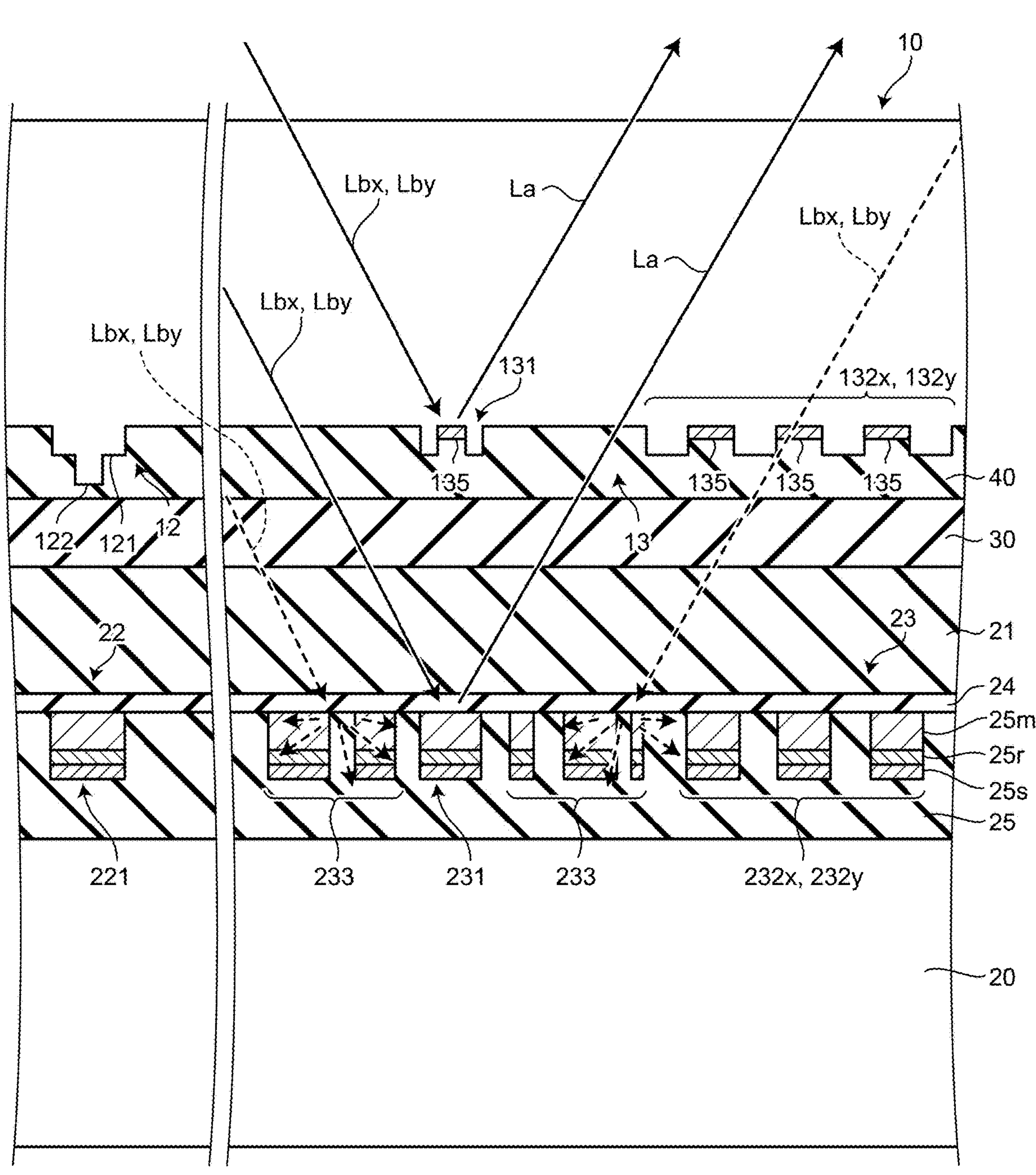
FIG. 12 is a schematic view illustrating a state of rough alignment using rough alignment marks according to the embodiment.

FIG. 12 is a schematic view illustrating a state of the rough alignment using the rough alignment marks 131 and 231 according to the embodiment.

As illustrated in FIG. 12, during the rough alignment, a part of the light Lbx and Lby transmitted through the polarizing filters 864*p* and 864*v* or the polarizing filters 865*p* and 865*v* is reflected by the rough alignment mark 131 of the template 10, and is detected as the light La by the imaging elements 84*a* to 84*d* of the detection system 86*a*.

In addition, another part of the light Lbx and Lby is reflected by the rough alignment mark 231 of the wafer 20, and is detected as the light La by the imaging elements 84*a* to 84*d* of the detection system 86*a*. Further, still another part of the light Lbx and Lby is incident on the peripheral region of the rough alignment mark 231. The auxiliary pattern 233 having a random dimensional distribution is arranged in the peripheral region of the rough alignment mark 231, and incident light to the peripheral region of the rough alignment mark 231 is dissipated by the auxiliary pattern 233 without being multiple-reflected in the lower layer film 25, for example.

Overview

In the manufacturing process of the semiconductor device, the imprinting processing by the imprinting device may be performed. In this case, a rough alignment mark and a fine alignment mark are provided on both the template and the wafer, and the alignment of the template and the wafer is performed prior to the imprinting processing.

The pattern dimension of the actual pattern and the pattern dimension of the configuration that has been formed in a lower layer of the actual pattern of the semiconductor device formed by the imprinting processing may be, for example, about several tens nm. Therefore, it is desirable that the actual pattern and the pattern of the lower layer formed by the imprinting processing are aligned with high accuracy with an error of about +10 nm.

In order to realize such precise alignment, a moiré type mark is used as the fine alignment mark, and further, bipolar illumination by polarized light is used as a light source for alignment. However, in the alignment using bipolar illumination, an error may occur in the detection position of the rough alignment mark.

Figure 13:
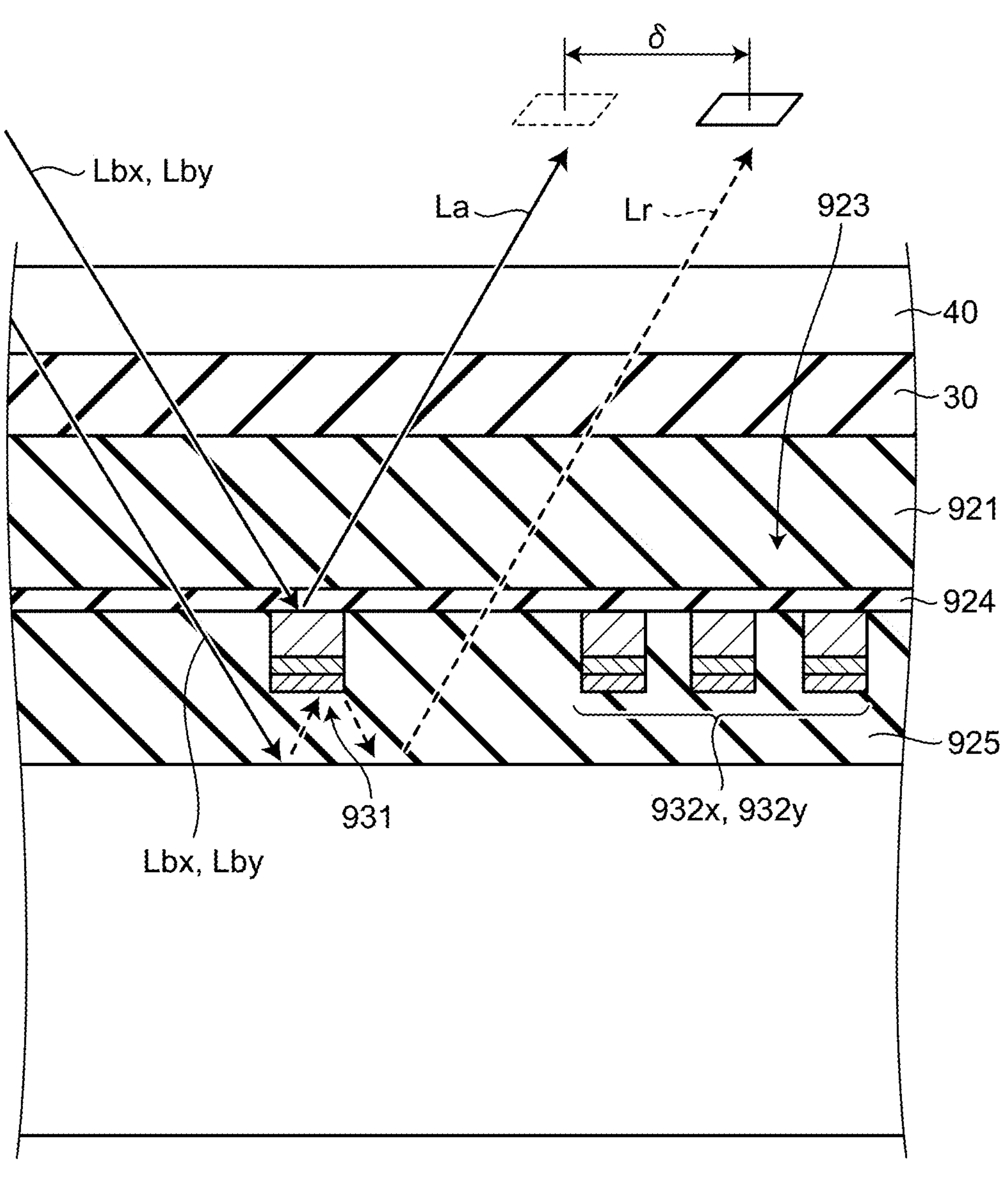
FIG. 13 is a schematic view illustrating a state of rough alignment using a rough alignment mark according to a comparative example.

FIG. 13 is a schematic view illustrating a state of the rough alignment using a rough alignment mark 931 according to a comparative example. As illustrated in FIG. 13, also in the comparative example, an alignment mark 923 including the rough alignment mark 931 and fine alignment marks 932*x* and 932*y* is provided on a lower layer film 925, and a base film 924 and a processing target film 921 are formed in this order on the lower layer film 925. The lower layer film 925, the base film 924, and the processing target film 921 are also transparent films such as silicon oxide films having optical transparency.

In a case where such a configuration is irradiated with the light Lbx and Lby by the bipolar illumination by the bipolar illumination, a part thereof is reflected by the rough alignment mark 931 to be detected as the light La. In addition, the other part of the light Lbx and Lby enters the peripheral region of the rough alignment mark 931, passes through the lower layer film 925 which is a transparent film, and is multiple-reflected in the lower layer film 925 to generate multiple-reflected light Lr. Such multiple-reflected light Lr may interfere with the light La or the like reflected by the rough alignment mark 931. For example, in the case of asymmetrically polarized illumination as described above, the detection direction of the rough alignment mark 931 can be shifted by an error δ in a direction in which the longitudinal direction of the configuration serving as the reflection surface of the light Lbx and Lby coincides with the polarization direction.

With the alignment marks 13 and 23 of the embodiment, in a case where the wafer 20 and the template 10 are arranged at the positions where the rough alignment marks 131 and 231 vertically overlap each other, the auxiliary pattern 233 is arranged at the position overlapping the peripheral region of the rough alignment mark 231, and the auxiliary pattern 233 has a random dimensional distribution.

In other words, the auxiliary pattern 233 includes the line-and-space pattern RLS extending in a direction along the X direction, and a line-and-space pattern CLS extending in a direction along the Y direction, and in each of the line-and-space patterns RLS and CLS, the widths of the lines RL and CL, the pitches between the lines RL and CL, the widths of the spaces RS and CS, and the pitches between the spaces RS and CS in the X direction or the Y direction randomly vary.

As described above, the light Lbx and Lby incident on the lower layer film 25 on which the auxiliary pattern 233 is arranged is dissipated by the auxiliary pattern 233 having a random dimensional distribution. Therefore, multiple reflection in the lower layer film 25 can be suppressed, and interference with the detection light of the rough alignment mark 131 can be suppressed. Accordingly, the alignment accuracy between the template 10 and the wafer 20 can be enhanced.

With the alignment marks 13 and 23 of the embodiment, the dimensional distribution of the auxiliary pattern 233 is within a range of equal to or greater than the minimum value and equal to or less than the maximum value of the dimension of the wiring 221 of the semiconductor device arranged in the lower layer film 25 in which the auxiliary pattern 233 is included. By defining the dimensional distribution of the auxiliary pattern 233 in this way, the auxiliary pattern 233 can be formed according to the design rule of the layer in which the auxiliary pattern 233 is included.

With the alignment marks 13 and 23 of the embodiment, the dimensional distribution of the auxiliary pattern 233 has the standard deviation as a value that is half of the difference between the minimum value and the maximum value of the dimension of the wiring 221 with the intermediate value of the dimension of the wiring 221 of the semiconductor device arranged in the lower layer film 25 in which the auxiliary pattern 233 is included, as the center.

Consequently, in forming the auxiliary pattern 233 according to the design rule, by distributing the dimension of the auxiliary pattern 233 in a well-balanced manner within a range of equal to or greater than the minimum value and equal to or less than the maximum value of the dimension of the partial configuration of the semiconductor device such as the wiring 221, the auxiliary pattern 233 can be formed.

With the alignment marks 13 and 23 of the embodiment, in a case where the wafer 20 and the template 10 are arranged at the positions where the rough alignment marks 131 and 231 vertically overlap each other, the auxiliary pattern 233 is arranged to surround the rough alignment mark 231 at the position overlapping the peripheral region of the rough alignment mark 231. As a result, it is possible to more reliably dissipate the light Lbx and Lby incident on the lower layer film 25, suppress multiple reflection, and improve the alignment accuracy between the template 10 and the wafer 20.

First Modification Example

Next, a configuration of the first modification example of the embodiment will be described with reference to FIG. 14. An auxiliary pattern 233*a* of the first modification example is different from the above-described embodiment in that the auxiliary pattern is arranged in a further lower layer of the lower layer film 25.

Figure 14:
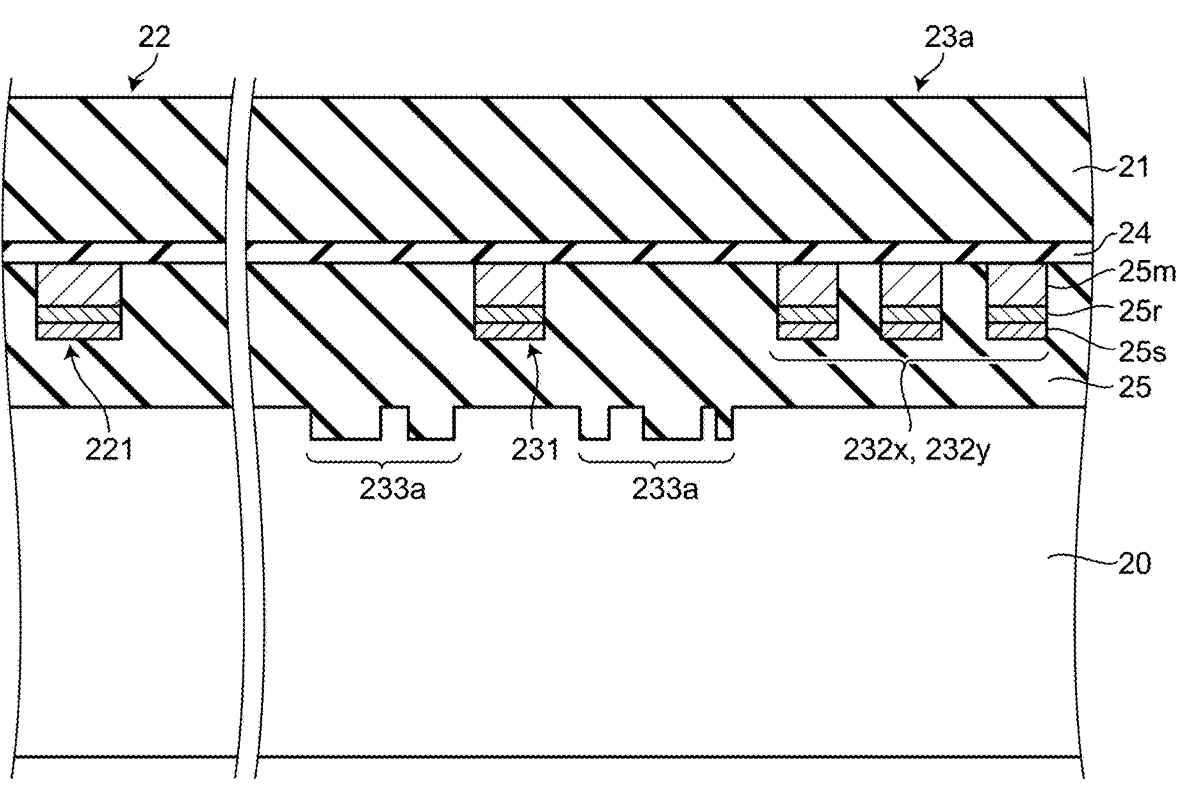
FIG. 14 is a cross-sectional view illustrating an example of a configuration of an alignment mark according to a first modification example of the embodiment.

FIG. 14 is a cross-sectional view illustrating an example of a configuration of an alignment mark 23*a* according to the first modification example of the embodiment. Note that, in FIG. 14, the same reference numerals are given to the same configurations as those of the above-described embodiment, and the description thereof will be omitted.

As illustrated in FIG. 14, the alignment mark 23*a* of the first modification example includes the rough alignment mark 231 and the fine alignment marks 232*x* and 232*y* arranged in the lower layer film 25 below the processing target film 21, similarly to the alignment mark 23 of the above-described embodiment.

In addition, the alignment mark 23*a* includes the auxiliary pattern 233*a* which is a further lower layer of the lower layer film 25, and is arranged in the wafer 20, for example. The auxiliary pattern 233*a* protrudes from the surface of the wafer 20 to the inside of the wafer 20. More specifically, the auxiliary pattern 233*a* includes a recess portion or the like provided on the surface of the wafer 20, and the recess portion is filled with a film formed immediately above the wafer 20. In the example of FIG. 14, the recess portion constituting the auxiliary pattern 233*a* is filled with the lower layer film 25 which is a direct upper film.

Here, the wafer 20 is provided with a transistor (not illustrated) or the like as a partial configuration of the semiconductor device. Therefore, in a case where the auxiliary pattern 233*a* is provided on the surface of the wafer 20, the dimensional distribution of the auxiliary pattern 233*a* is determined based on the dimension of the configuration such as the transistor, for example. The transistor is an example of an actual pattern.

Note that, regardless of the example of FIG. 14, the auxiliary pattern 233*a* of the first modification example can be arranged in another film positioned further below the lower layer film 25. That is, in a case where other films such as one or more silicon oxide films are disposed between the wafer 20 and the lower layer film 25, the auxiliary pattern 233*a* can be disposed on any one of these films. The film that is a further lower layer of the lower layer film 25 and in which the auxiliary pattern 233*a* is arranged is an example of a second film.

As described above, even in a case where the auxiliary pattern 233*a* is provided in a further lower layer of the lower layer film 25, by arranging the auxiliary pattern 233*a* to vertically overlap the peripheral region of the rough alignment mark 231, the light Lbx and Lby transmitted through the lower layer film 25, which is a transparent film, can be dissipated by the auxiliary pattern 233*a*, and multiple reflection of the light Lbx and Lby can be suppressed.

With the alignment mark 23*a* of the first modification example, the same effects as those of the alignment mark 23 of the above-described embodiment are obtained.

Second Modification Example

Next, a configuration of the second modification example of the embodiment will be described with reference to FIG. 15. An auxiliary pattern 233*b* of the second modification example is different from the above-described embodiment in that the auxiliary pattern is arranged in the processing target film 21.

Figure 15:
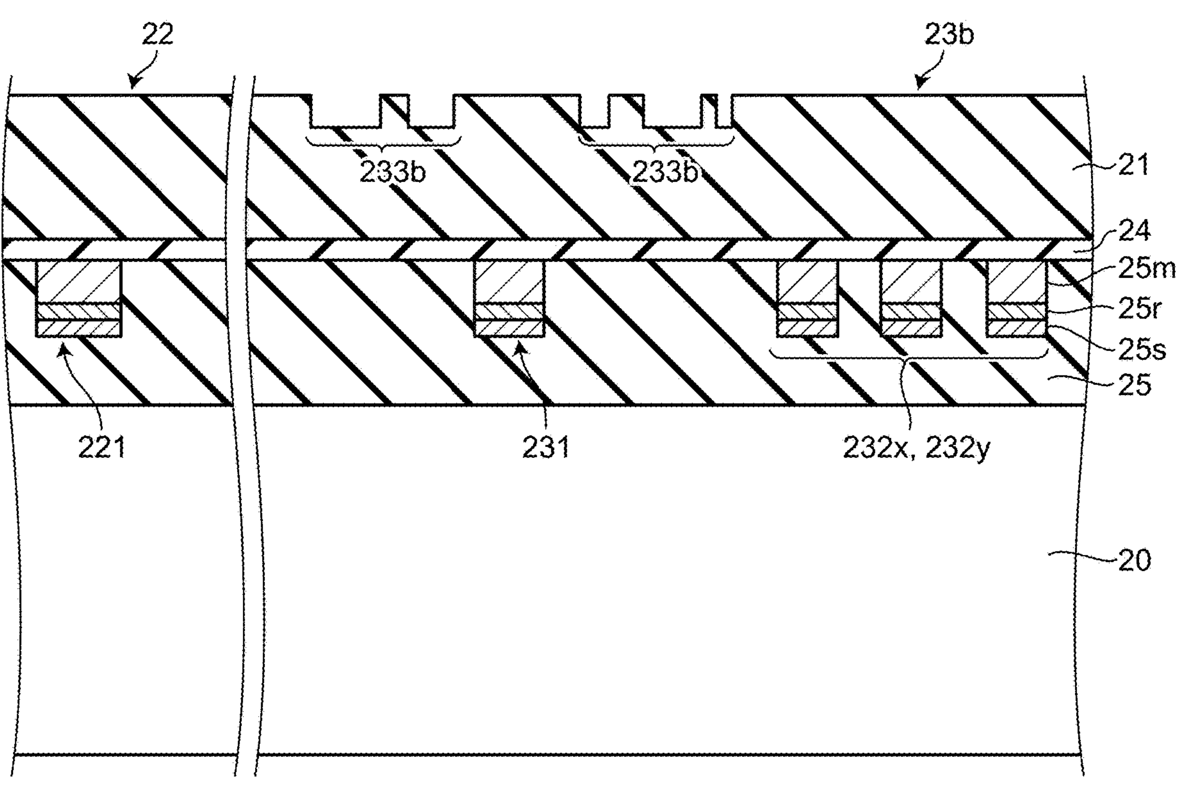
FIG. 15 is a cross-sectional view illustrating an example of a configuration of an alignment mark according to a second modification example of the embodiment.

FIG. 15 is a cross-sectional view illustrating an example of a configuration of an alignment mark 23*b* according to the second modification example of the embodiment. Note that, in FIG. 15, the same reference numerals are given to the same configurations as those of the above-described embodiment, and the description thereof will be omitted.

As illustrated in FIG. 15, the alignment mark 23*b* of the second modification example includes the rough alignment mark 231 and the fine alignment marks 232*x* and 232*y* arranged in the lower layer film 25 below the processing target film 21, similarly to the alignment mark 23 of the above-described embodiment.

The alignment mark 23*b* includes the auxiliary pattern 233*b* arranged in the processing target film 21. The auxiliary pattern 233*b* protrudes from the surface of the processing target film 21 to the inside of the processing target film 21. More specifically, the auxiliary pattern 233*b* includes a recess portion or the like provided on the surface of the processing target film 21.

In this case, the dimensional distribution of the auxiliary pattern 233*b* is determined based on the dimension of the partial configuration of the semiconductor device such as a dual damascene structure to be formed later on the processing target film 21. Alternatively, the dimensional distribution of the auxiliary pattern 233*b* may be determined based on the dimension of the pattern 12 of the template 10 that is a partial configuration of the semiconductor device in the processing target film 21.

As described above, even in a case where the auxiliary pattern 233*b* is provided on the upper layer of the lower layer film 25, by arranging the auxiliary pattern 233*b* to vertically overlap the peripheral region of the rough alignment mark 231, the light Lbx and Lby, which is incident on the processing target film 21 as a transparent film and is to be incident on the lower layer film 25 around the rough alignment mark 231, is dissipated by the auxiliary pattern 233*b*, and the multiple reflection of the light Lbx and Lby can be suppressed.

With the alignment mark 23*b* of the second modification example, the same effects as those of the alignment mark 23 of the above-described embodiment are obtained.

Third Modification Example

Next, a configuration of the third modification example of the embodiment will be described with reference to FIG. 16. An auxiliary pattern 131*c* of the third modification example is different from the above-described embodiment in that the auxiliary pattern is arranged on a template 10*c*.

Figure 16:
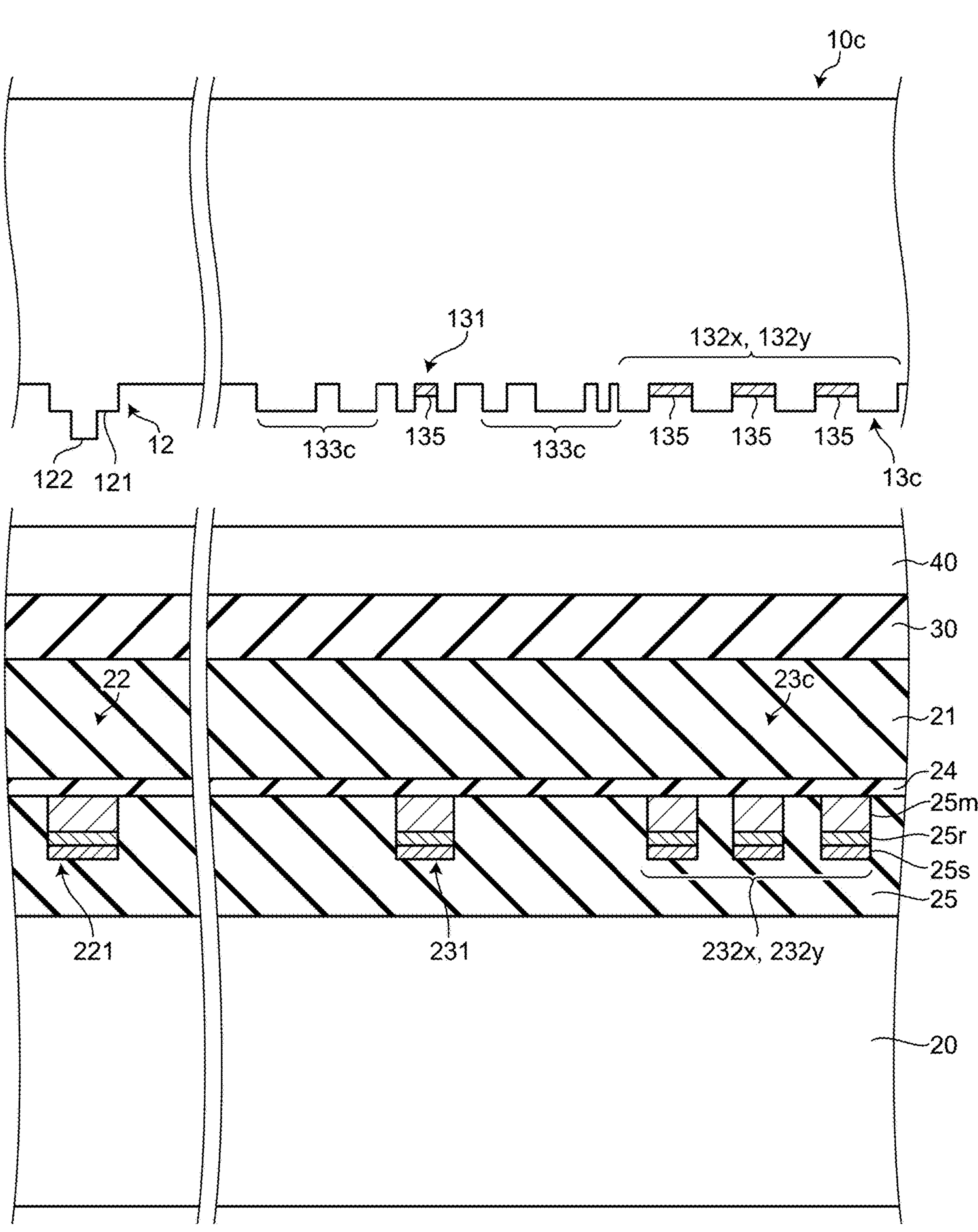
FIG. 16 is a cross-sectional view illustrating an example of a configuration of alignment marks according to a third modification example of the embodiment.

FIG. 16 is a cross-sectional view illustrating an example of a configuration of alignment marks 13*c* and 23*c* according to the third modification example of the embodiment. Note that, in FIG. 16, the same reference numerals are given to the same configurations as those of the above-described embodiment, and the description thereof will be omitted.

As illustrated in FIG. 16, the alignment mark 23*c* of the third modification example includes the rough alignment mark 231 and the fine alignment marks 232*x* and 232*y* arranged in the lower layer film 25 below the processing target film 21, similarly to the alignment mark 23 of the above-described embodiment.

Similarly to the alignment mark 13 of the above-described embodiment, the alignment mark 13*c* of the third modification example includes the rough alignment mark 131 and the fine alignment marks 132*x* and 132*y* on a surface of the template 10*c* on which the pattern 12 is formed.

The alignment mark 13*c* includes an auxiliary pattern 133*c* arranged on the same surface as the rough alignment mark 131 and the fine alignment marks 132*x* and 132*y* of the template 10*c*. The auxiliary pattern 133*c* protrudes from the surface of the template 10*c* similarly to the rough alignment mark 131 and the fine alignment marks 132*x* and 132*y*.

In this case, the protrusion height of the auxiliary pattern 133*c* from the surface of the template 10*c* may be equal to the protrusion height of the line 121 of the pattern 12, for example, similarly to the rough alignment mark 131 and the fine alignment marks 132*x* and 132*y*. Alternatively, the protrusion height of the auxiliary pattern 133*c* may be equal to the protrusion height of the columnar portion 122 of the pattern 12, for example.

Alternatively, the protrusion heights of the line 121 and the columnar portion 122 of the pattern 12 may be mixed in the protrusion height of the auxiliary pattern 133*c*. In this case, the auxiliary pattern 133*c* can be configured such that the protrusion height equal to the line 121 and the protrusion height equal to the columnar portion 122 randomly vary. In this way, by providing the auxiliary pattern 133*c* with at least two protrusion heights, a height parameter can also be added in a case of setting the dimensional distribution of the auxiliary pattern 133*c*, and the auxiliary pattern 133*c* configured more randomly can be obtained.

As described above, even in a case where at least a part of the auxiliary pattern 133*c* has a protrusion height equal to that of the columnar portion 122, or even in a case where the auxiliary pattern 133*c* is transferred to the processing target film 21 of the wafer 20 together with the pattern 12, the partial configuration or the like of the semiconductor device is not disposed at the transfer position of the auxiliary pattern 133*c*, and the transferred auxiliary pattern 133*c* does not affect the electrical characteristics of the semiconductor device.

In a case where the auxiliary pattern 133*c* is arranged on the template 10*c*, the dimensional distribution of the auxiliary pattern 133*c* is determined based on the dimension of the pattern 12 of the template 10.

As described above, even in a case where the auxiliary pattern 133*c* is provided on the template 10, by arranging the auxiliary pattern 133*c* to vertically overlap the peripheral region of the rough alignment mark 231, the light Lbx and Lby to be incident on the processing target film 21 as a transparent film and the lower layer film 25 around the rough alignment mark 231 can be dissipated by the auxiliary pattern 133*c*, and the multiple reflection of the light Lbx and Lby can be suppressed.

With the alignment marks 13*c* and 23*c* of the third modification example, the same effects as those of the alignment marks 13 and 23 of the above-described embodiment are obtained.

Another Modification Example

In the above-described embodiment and the like, the auxiliary pattern 233 of the alignment mark 23 is arranged to surround the rough alignment mark 231 at a position overlapping the peripheral region of the rough alignment mark 231. However, the auxiliary pattern 233 may be arranged to sandwich the rough alignment mark 231 from at least one of the X direction and the Y direction.

Figure 17A:
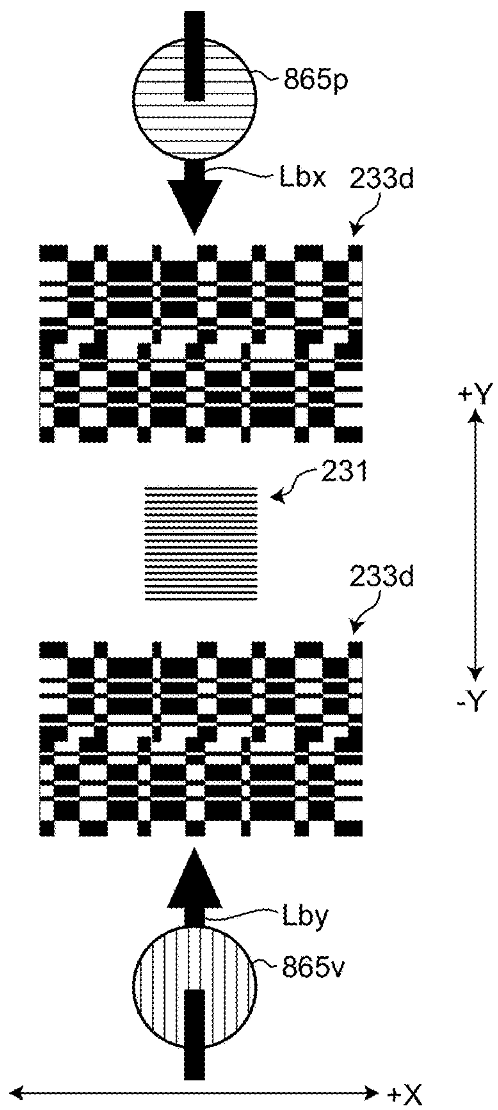
FIGS. 17A and 17B are partially enlarged top views illustrating an example of a configuration of an alignment mark according to another modification example of the embodiment.
Figure 17B:
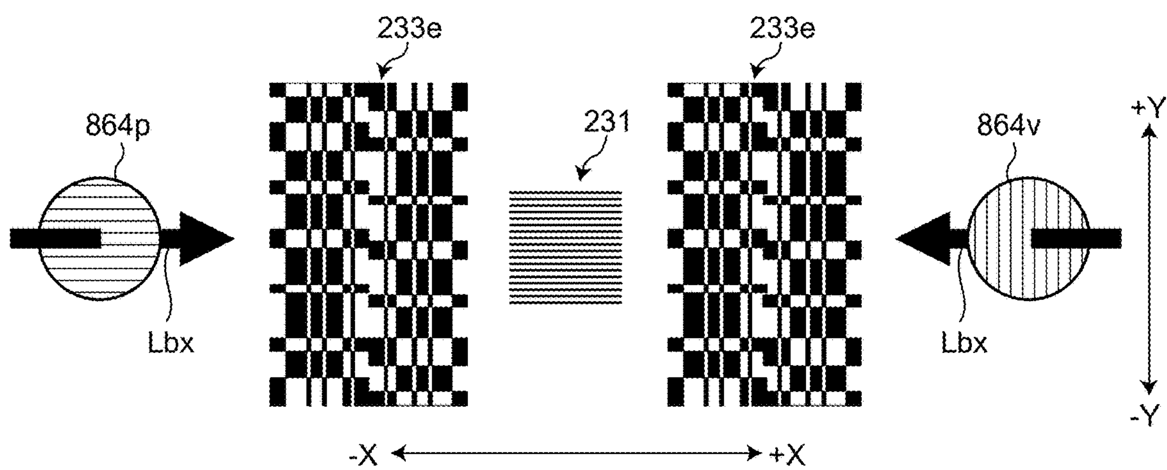

FIGS. 17A and 17B are partially enlarged top views illustrating an example of a configuration of an alignment mark according to another modification example of the embodiment. In FIGS. 17A and 17B, the left and right directions on the paper are defined as the −X direction and the +X direction, respectively, and the up and down directions on the paper are defined as the +Y direction and the −Y direction.

FIG. 17A illustrates an example of an auxiliary pattern 233*d* configured to sandwich the rough alignment mark 231 from the Y direction. As illustrated in FIG. 17A, for example, in a case where rough alignment using the rough alignment marks 131 and 231 is performed by irradiation with the light Lbx and Lby from both sides in the Y direction, the auxiliary pattern 233*d* can be arranged to sandwich the rough alignment mark 231 from the Y direction.

In this case, the widths of the auxiliary pattern 233*d* in the X direction and the Y direction can be equal to or greater than the widths of the rough alignment mark 231 in the X direction and the Y direction, respectively. In addition, the distance between the end portions of the auxiliary patterns 233*d* on both sides of the rough alignment mark 231 on the side away from the rough alignment mark 231 can be set to be equal to or less than the widths of the fine alignment marks 232*x* and 232*y* in the Y direction.

FIG. 17B illustrates an example of an auxiliary pattern 233*e* configured to sandwich the rough alignment mark 231 from the X direction. As illustrated in FIG. 17B, for example, in a case where rough alignment using the rough alignment marks 131 and 231 is performed by irradiation with the light Lbx and Lby from both sides in the X direction, the auxiliary pattern 233*e* can be arranged to sandwich the rough alignment mark 231 from the X direction.

In this case, the width of the auxiliary pattern 233*d* in the X direction can be equal to or greater than the width of the rough alignment mark 231 in the X direction. In addition, the width of the auxiliary pattern 233*e* in the Y direction can be equal to or greater than the width of the rough alignment mark 231 in the Y direction, and can be equal to or greater than the widths of the fine alignment marks 232*x* and 232*y* in the Y direction.

With the alignment marks of another modification example, in a case where the wafer and the template are arranged at the positions where the rough alignment marks 131 and 231 vertically overlap each other, the auxiliary patterns 233*d* and 233*e* are arranged at least at the positions where auxiliary patterns overlap the peripheral region of the rough alignment mark 231 and sandwich the rough alignment mark 231 from the X direction or the Y direction.

In the case of asymmetrically polarized illumination, the shift of the detection position of the rough alignment mark 231 may depend on, for example, the incident directions of the light Lbx and Lby. As described above, by arranging the auxiliary patterns 233*d* and 233*e* at least on the incident direction side of the light Lbx and Lby, it is possible to suppress the shift of the detection position of the rough alignment mark 231 and to enhance the alignment accuracy.

With the alignment mark of another modification example, each of the auxiliary patterns 233*d* on both sides of the rough alignment mark 231 has a width in the Y direction equal to or greater than the width of the rough alignment mark 231 in the Y direction. As a result, in the case of rough alignment, for example, the light Lbx and Lby incident from the Y direction can be dissipated over the entire width of the rough alignment mark 231 in the Y direction by the auxiliary pattern 233*d*, and the alignment accuracy can be enhanced.

With the alignment mark of another modification example, the distance between the end portions of the auxiliary patterns 233*d* on both sides of the rough alignment mark 231 on the side away from the rough alignment mark 231 is equal to or less than the widths of the fine alignment marks 232*x* and 232*y* in the Y direction. Consequently, the auxiliary pattern 233*e* can be arranged while being accommodated in the mark region of the alignment mark.

With the alignment mark of another modification example, each of the auxiliary patterns 233*e* on both sides of the rough alignment mark 231 has a width in the X direction equal to or greater than the width of the rough alignment mark 231 in the X direction. As a result, in the case of rough alignment, for example, the light Lbx and Lby incident from the X direction can be dissipated over the entire width of the rough alignment mark 231 in the X direction by the auxiliary pattern 233*e*, and the alignment accuracy can be enhanced.

With the alignment mark of another modification example, each of the auxiliary patterns 233*e* on both sides of the rough alignment mark 231 has a width in the Y direction equal to or less than the width of the fine alignment marks 232*x* and 232*y* in the Y direction. Consequently, the auxiliary pattern 233*e* can be arranged while being accommodated in the mark region of the alignment mark.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An alignment mark comprising:

a first mark that is arranged in a first film having optical transparency of a first substrate on which a semiconductor device is manufactured;

a second mark that is arranged in a second substrate having a first pattern to be transferred to the first substrate side, and is used for alignment with the first mark; and a second pattern that is arranged in at least any of the first and second substrates at a position overlapping a peripheral region of the first mark when viewed from the second substrate side, the first substrate and the second substrate being arranged at positions where the first and second marks vertically overlap each other, wherein the second pattern has a random dimensional distribution.

2. The alignment mark according to claim 1, wherein the dimensional distribution of the second pattern is in a range of equal to or greater than a minimum value and equal to or less than a maximum value of a dimension of an actual pattern of the semiconductor device arranged in a layer in which the second pattern is included.

3. The alignment mark according to claim 1, wherein the dimensional distribution of the second pattern has a standard deviation as a value that is half of a difference between a minimum value and a maximum value of a dimension of an actual pattern of the semiconductor device arranged in a layer in which the second pattern is included, with an intermediate value of the dimension of the actual pattern as a center.

4. The alignment mark according to claim 1, further comprising:

a third mark that is arranged in the first film to be adjacent to the first mark, and has a periodic structure in a first direction along the first film; and a fourth mark that is arranged in the second substrate to be adjacent to the second mark, has a periodic structure in the first direction, and is used for alignment with the third mark, wherein the second pattern is arranged in at least any of the first and second substrates at a position overlapping the peripheral region of the first mark to sandwich the first mark from a second direction intersecting the first direction along the first film, when viewed from the second substrate side.

5. The alignment mark according to claim 4, wherein each of the second patterns on both sides of the first mark has a width in the second direction equal to or greater than a width of the first mark in the second direction.

6. The alignment mark according to claim 1, wherein the second pattern is arranged in at least any of the first and second substrates at a position overlapping the peripheral region of the first mark to surround the first mark, when viewed from the second substrate side.

7. The alignment mark according to claim 1, wherein the first film is arranged below a processing target film, the processing target film being processed into a shape of the first pattern, and the second pattern is arranged in the first film.

8. The alignment mark according to claim 1, wherein the second pattern is arranged in a processing target film which is above the first film and is processed into a shape of the first pattern, in a second film having the optical transparency or the first substrate which is below the first film, or on a surface of the second substrate having the first pattern, together with the second mark.

9. The alignment mark according to claim 1, wherein the first substrate is a semiconductor substrate, an insulating substrate, or a conductive substrate, and the second substrate is a template.

10. An imprinting method using an alignment mark, the alignment mark including:

a first mark that is arranged in a first film having optical transparency of a first substrate on which a device is manufactured;

a second mark that is arranged in a second substrate having a first pattern to be transferred to the first substrate side, and is used for alignment with the first mark; and a second pattern that is arranged in at least any of the first and second substrates at a position overlapping a peripheral region of the first mark when viewed from the second substrate side, the first substrate and the second substrate being arranged at positions where the first and second marks vertically overlap each other, the second pattern having a random dimensional distribution, the imprinting method comprising:

arranging the first substrate and the second substrate at positions where the first and second marks vertically overlap each other; and performing alignment of the first substrate and the second substrate while observing the first and second marks from the second substrate side, and then transferring the second pattern to the first substrate side.

11. An alignment mark comprising:

a first mark that is arranged in a first film having optical transparency of a first substrate on which a semiconductor device is manufactured;

a second mark that is arranged in a second substrate having a first pattern to be transferred to the first substrate side, and is used for alignment with the first mark; and a second pattern that is arranged in at least any of the first and second substrates at a position overlapping a peripheral region of the first mark when viewed from the second substrate side, the first substrate and the second substrate being arranged at positions where the first and second marks vertically overlap each other, wherein the second pattern has a first line-and-space pattern extending in a first direction along the first film, a second line-and-space pattern extending in a second direction that is along the first film and intersects the first direction, in the first line-and-space pattern, each of a line width, a pitch between lines, a space width, a pitch between spaces in the second direction varies by taking a dispersed value, and in the second line-and-space pattern, each of a line width, a pitch between lines, a space width, a pitch between spaces in the first direction varies by taking a dispersed value.

12. The alignment mark according to claim 11, wherein a space pattern is arranged at a portion where lines of the first and second line- and-space patterns intersect each other.

13. The alignment mark according to claim 11, further comprising:

a third mark that is arranged in the first film to be adjacent to the first mark, and has a periodic structure in the first direction; and a fourth mark that is arranged in the second substrate to be adjacent to the second mark, has a periodic structure in the first direction, and is used for alignment with the third mark, wherein in a case where the first substrate and the second substrate are arranged at positions where the first and second marks vertically overlap each other, the second pattern is arranged in at least any of the first and second substrates, at a position overlapping the peripheral region of the first mark to sandwich the first mark from the second direction, when viewed from the second substrate side.

14. The alignment mark according to claim 13, wherein each of the second patterns on both sides of the first mark has a width in the second direction equal to or greater than a width of the first mark in the second direction.

15. The alignment mark according to claim 11, wherein in a case where the first substrate and the second substrate are arranged at positions where the first and second marks vertically overlap each other, the second pattern is arranged in at least any of the first and second substrates, at a position overlapping the peripheral region of the first mark to surround the first mark, when viewed from the second substrate side.

16. The alignment mark according to claim 11, wherein the first film is arranged below a processing target film, the processing target film being processed into a shape of the first pattern, and the second pattern is arranged in the first film.

17. The alignment mark according to claim 11, wherein the second pattern is arranged in a processing target film which is above the first film and is processed into a shape of the first pattern, or in a second film having the optical transparency or the first substrate which is below the first film.

18. The alignment mark according to claim 11, wherein the second pattern is arranged on a surface of the second substrate having the first pattern, together with the second mark.

19. The alignment mark according to claim 11, wherein the first substrate is a semiconductor substrate, an insulating substrate, or a conductive substrate, and the second substrate is a template.

20. An imprinting method using an alignment mark, the alignment mark including:

a first mark that is arranged in a first film having optical transparency of a first substrate;

a second mark that is arranged in a second substrate having a first pattern to be transferred to the first substrate side, and is used for alignment with the first mark; and a second pattern that is arranged in at least any of the first and second substrates at a position overlapping a peripheral region of the first mark, when viewed from the second substrate side, the first substrate and the second substrate being arranged at positions where the first and second marks vertically overlap each other, the second pattern having a first line-and-space pattern extending in a first direction along the first film, a second line-and-space pattern extending in a second direction that is along the first film and intersects the first direction, in the first line-and-space pattern, each of a line width, a pitch between lines, a space width, a pitch between spaces in the second direction varies by taking a dispersed value, and in the second line-and-space pattern, each of a line width, a pitch between lines, a space width, a pitch between spaces in the first direction varies by taking a dispersed value, the imprinting method comprising:

arranging the first substrate and the second substrate at positions where the first and second marks vertically overlap each other; and performing alignment of the first substrate and the second substrate while observing the first and second marks from the second substrate side, and then transferring the second pattern to the first substrate side.

* * * * *